US011031387B2

(12) United States Patent
Then et al.

(10) Patent No.: US 11,031,387 B2
(45) Date of Patent: Jun. 8, 2021

(54) PN DIODES AND CONNECTED GROUP III-N DEVICES AND THEIR METHODS OF FABRICATION

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/322,082

(22) PCT Filed: Sep. 30, 2016

(86) PCT No.: PCT/US2016/055008
§ 371 (c)(1),
(2) Date: Jan. 30, 2019

(87) PCT Pub. No.: WO2018/063395
PCT Pub. Date: Apr. 5, 2018

(65) Prior Publication Data
US 2019/0189611 A1    Jun. 20, 2019

(51) Int. Cl.
*H01L 27/02* (2006.01)
*H01L 29/08* (2006.01)
(Continued)

(52) U.S. Cl.
CPC ........ *H01L 27/0255* (2013.01); *C23C 16/042* (2013.01); *C23C 16/303* (2013.01);
(Continued)

(58) Field of Classification Search
CPC ........... H01L 21/02381; H01L 21/0254; H01L 21/0262; H01L 21/8258; H01L 27/0248;
(Continued)

(56) References Cited

U.S. PATENT DOCUMENTS 6,689,648 B2   2/2004   Ko et al.
7,687,834 B2   3/2010   Kapoor
(Continued)

OTHER PUBLICATIONS

International Search Report and Written Opinion for International Patent Application No. PCT/US2016/055008 dated Jun. 21, 2017, 13 pgs.
(Continued)

*Primary Examiner* — Andrew Q Tran
(74) *Attorney, Agent, or Firm* — Schwabe, Williamson & Wyatt, P.C.

(57) ABSTRACT

A semiconductor structure including a group III-N semiconductor material is disposed on a silicon substrate. A group III-N transistor structure is disposed on the group III-N semiconductor material. A well is disposed in the silicon substrate. The well has a first conductivity type. A doped region is disposed in the well. The doped region has a second conductivity type that is opposite to the first conductivity type. A first electrode is connected to the well of the second conductivity type and a second electrode is connected to the doped region having a first conductivity type. The well and the doped region form a PN diode. The well or the doped region is connected to the raised drain structure of the group III-N transistor.

24 Claims, 16 Drawing Sheets

(51) Int. Cl.

| | |
|---|---|
| *H01L 29/20* | (2006.01) |
| *H01L 29/778* | (2006.01) |
| *H01L 29/861* | (2006.01) |
| *C23C 16/04* | (2006.01) |
| *C23C 16/30* | (2006.01) |
| *H01L 21/02* | (2006.01) |
| *H01L 21/8258* | (2006.01) |
| *H01L 29/167* | (2006.01) |
| *H01L 29/205* | (2006.01) |
| *H01L 29/417* | (2006.01) |
| *H01L 29/66* | (2006.01) |
| *H01L 29/06* | (2006.01) |
| *H01L 29/423* | (2006.01) |
| *H01L 21/033* | (2006.01) |
| *H01L 21/265* | (2006.01) |
| *H01L 21/3065* | (2006.01) |
| *H01L 21/311* | (2006.01) |
| *H01L 21/321* | (2006.01) |
| *H01L 29/36* | (2006.01) |
| *H01L 29/40* | (2006.01) |

(52) U.S. Cl.
CPC ...... *H01L 21/0254* (2013.01); *H01L 21/0262* (2013.01); *H01L 21/02381* (2013.01); *H01L 21/8258* (2013.01); *H01L 27/0248* (2013.01); *H01L 29/0847* (2013.01); *H01L 29/167* (2013.01); *H01L 29/2003* (2013.01); *H01L 29/205* (2013.01); *H01L 29/41783* (2013.01); *H01L 29/66136* (2013.01); *H01L 29/66462* (2013.01); *H01L 29/7786* (2013.01); *H01L 29/7787* (2013.01); *H01L 29/861* (2013.01); *H01L 29/8611* (2013.01); *H01L 21/0332* (2013.01); *H01L 21/26513* (2013.01); *H01L 21/3065* (2013.01); *H01L 21/31111* (2013.01); *H01L 21/31144* (2013.01); *H01L 21/3212* (2013.01); *H01L 29/0649* (2013.01); *H01L 29/36* (2013.01); *H01L 29/401* (2013.01); *H01L 29/4236* (2013.01)

(58) Field of Classification Search
CPC ............. H01L 27/0255; H01L 29/0847; H01L 29/167; H01L 29/2003; H01L 29/205; H01L 29/41783; H01L 29/66136; H01L 29/66462; H01L 29/7786; H01L 29/7787; H01L 29/861; H01L 29/8611
See application file for complete search history.

(56) References Cited

U.S. PATENT DOCUMENTS

| | | |
|---|---|---|
| 8,481,374 B2 | 7/2013 | Scheiper |
| 2007/0278612 A1 | 12/2007 | Williams |
| 2008/0042208 A1 | 2/2008 | Hshieh |
| 2009/0278204 A1 | 11/2009 | Morino |
| 2010/0078724 A1 | 4/2010 | Imoto |
| 2012/0025276 A1 | 2/2012 | Stephan et al. |
| 2016/0163695 A1* | 6/2016 | Decoutere ............. H01L 27/085 257/195 |
| 2019/0189611 A1* | 6/2019 | Then ................. H01L 29/66136 |

OTHER PUBLICATIONS

Office Action from Taiwan Patent Application No. 106128294, dated Nov. 25, 2020, 5 pgs.

\* cited by examiner

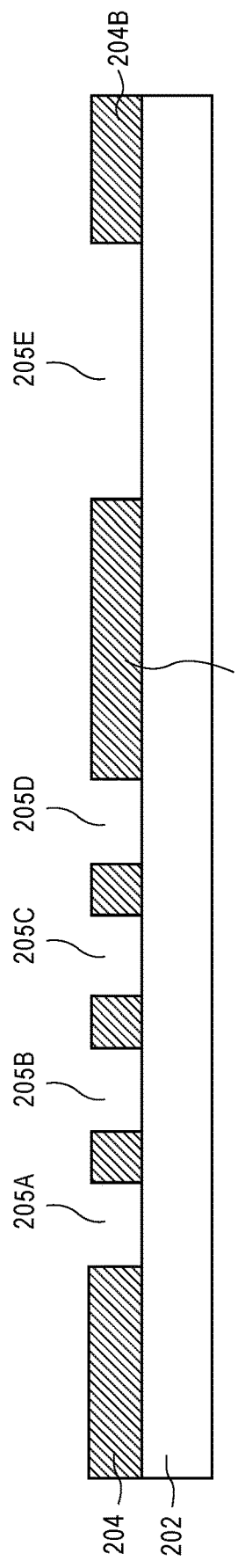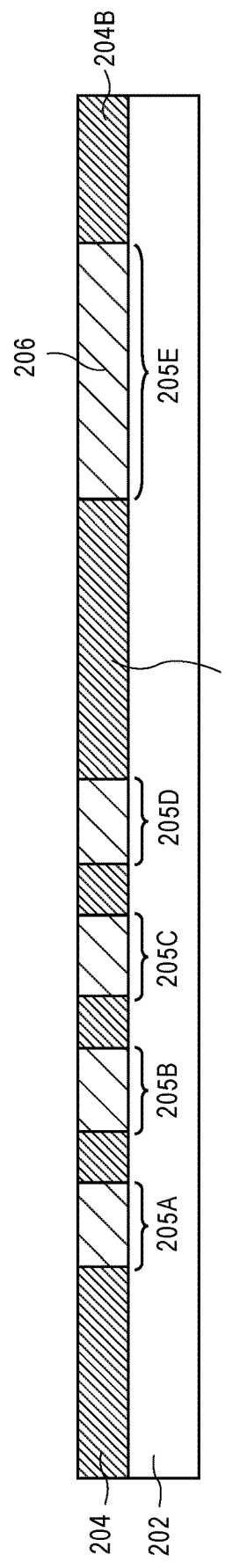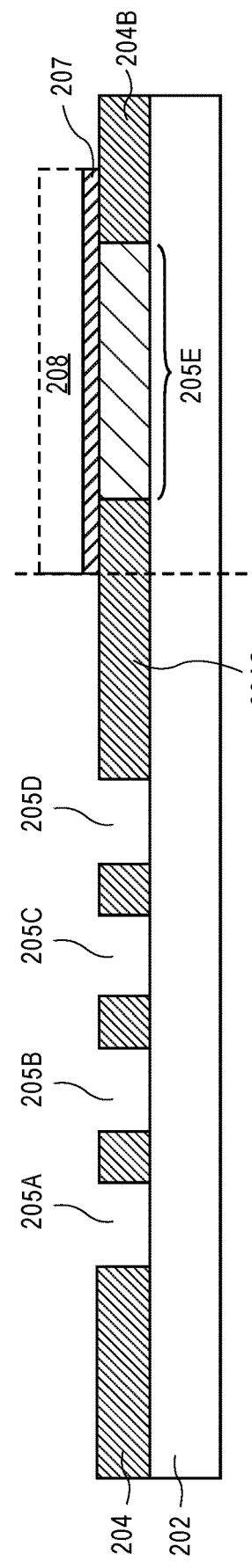

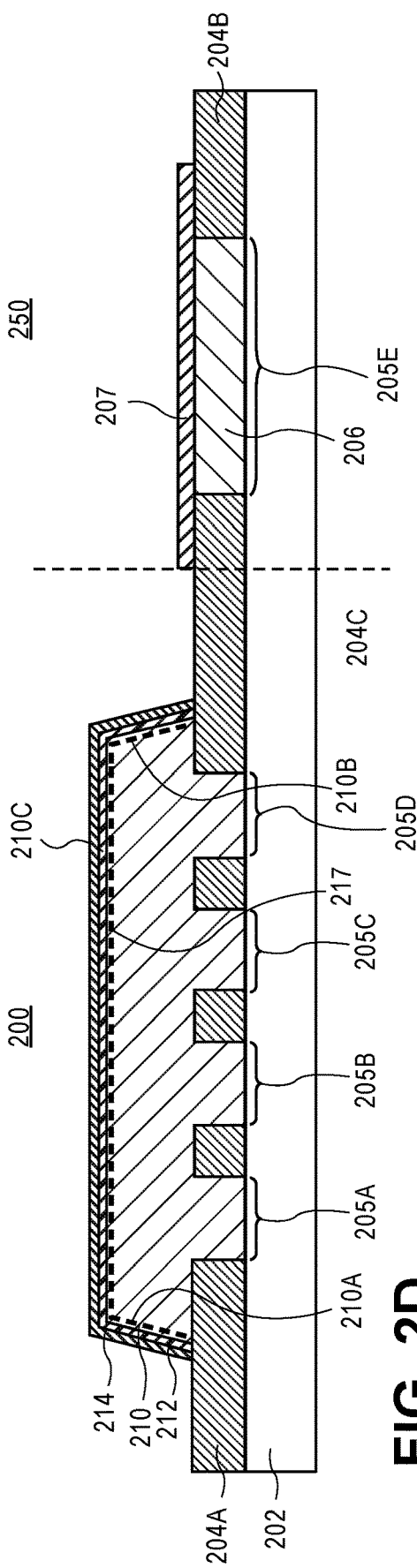
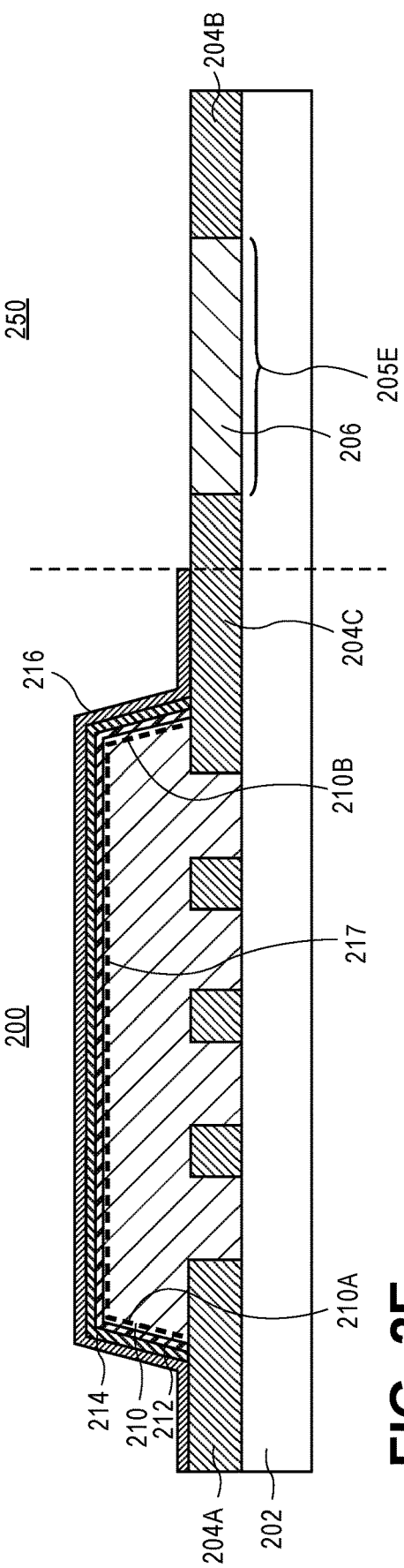

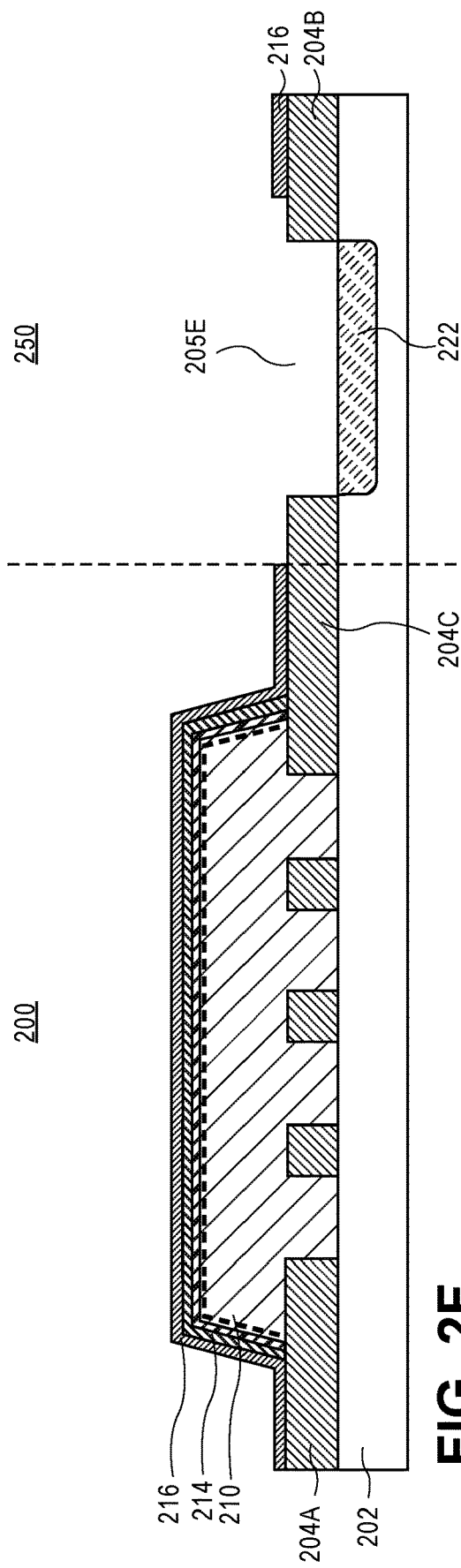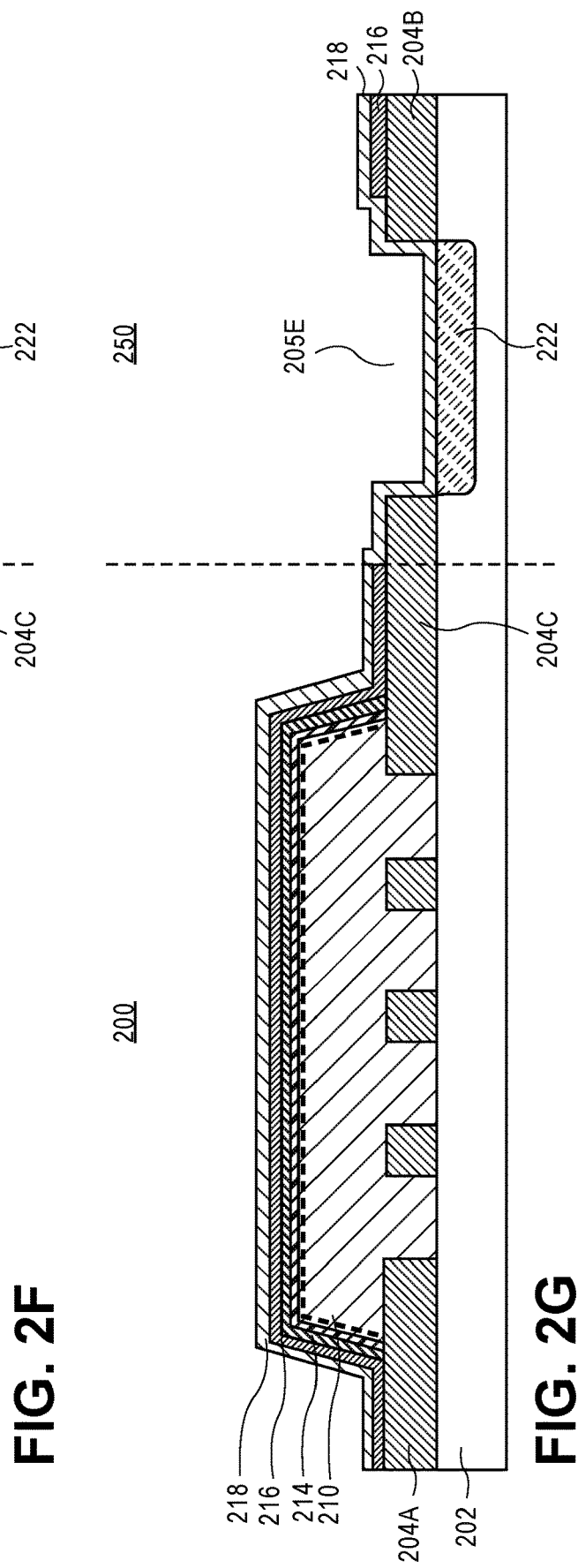

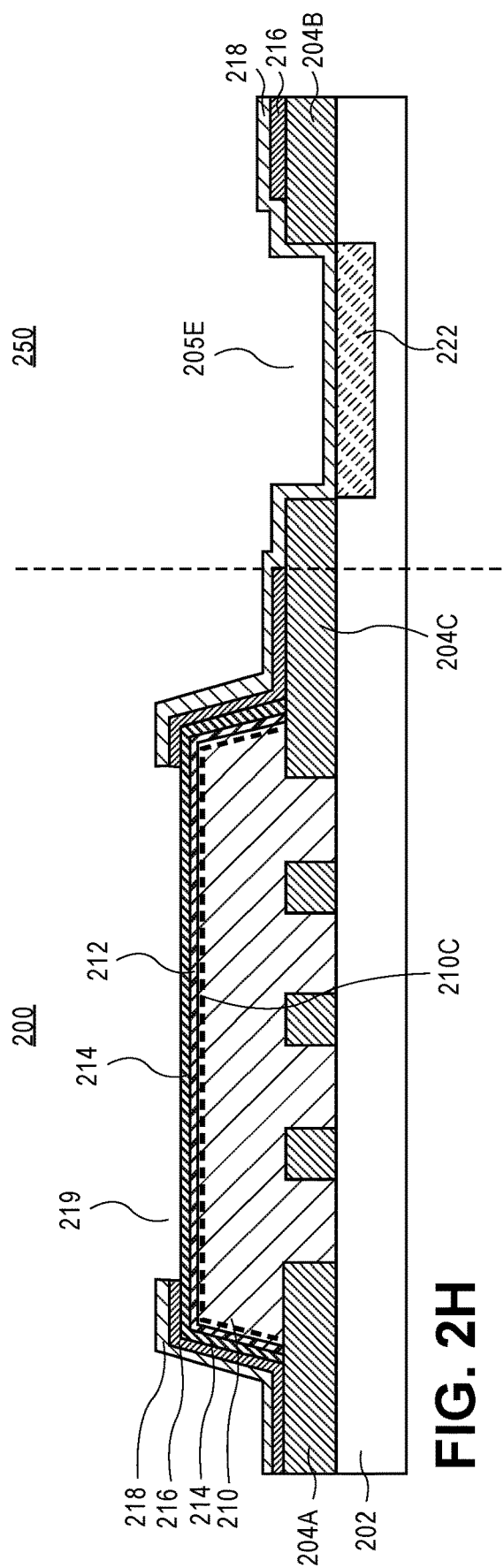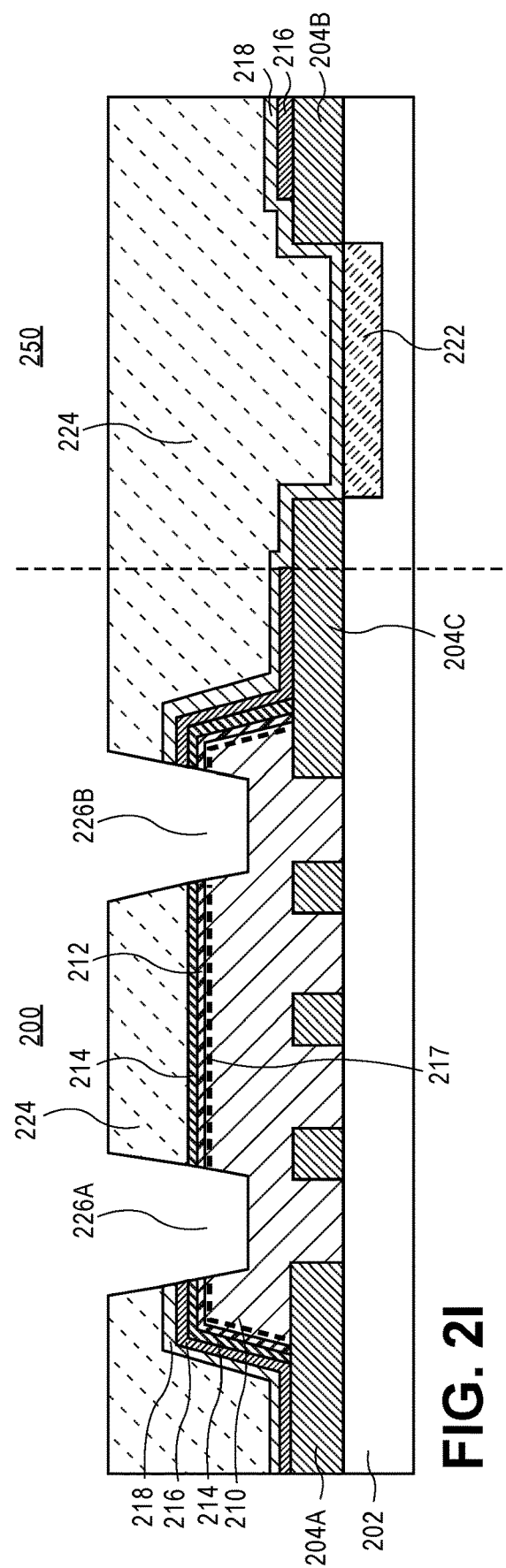

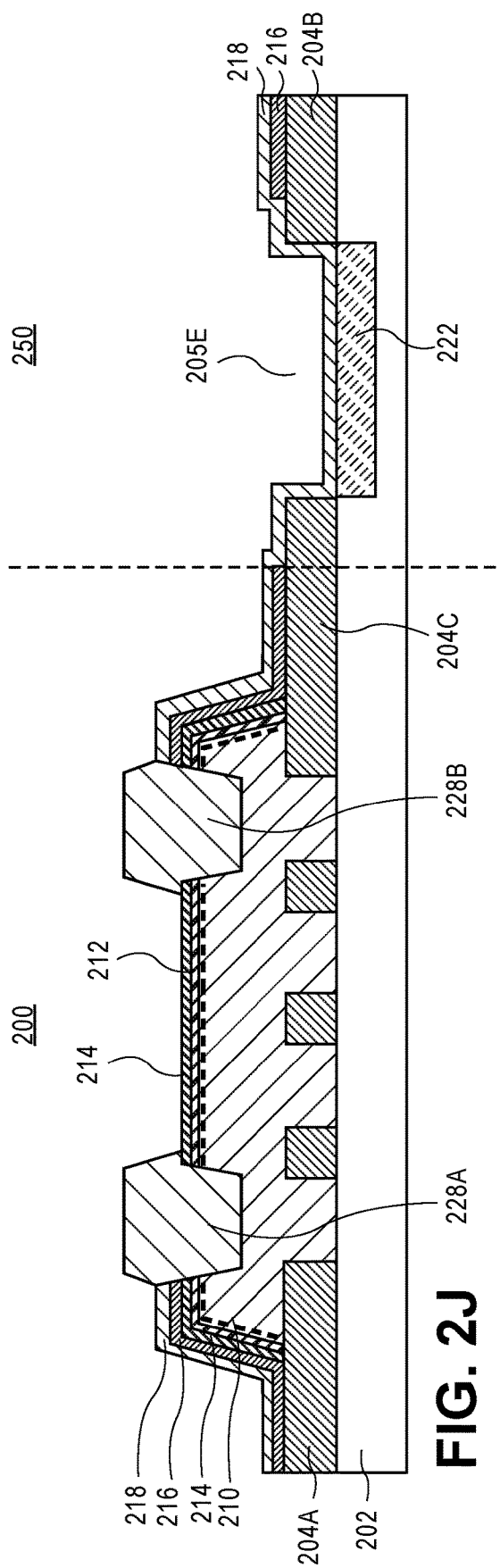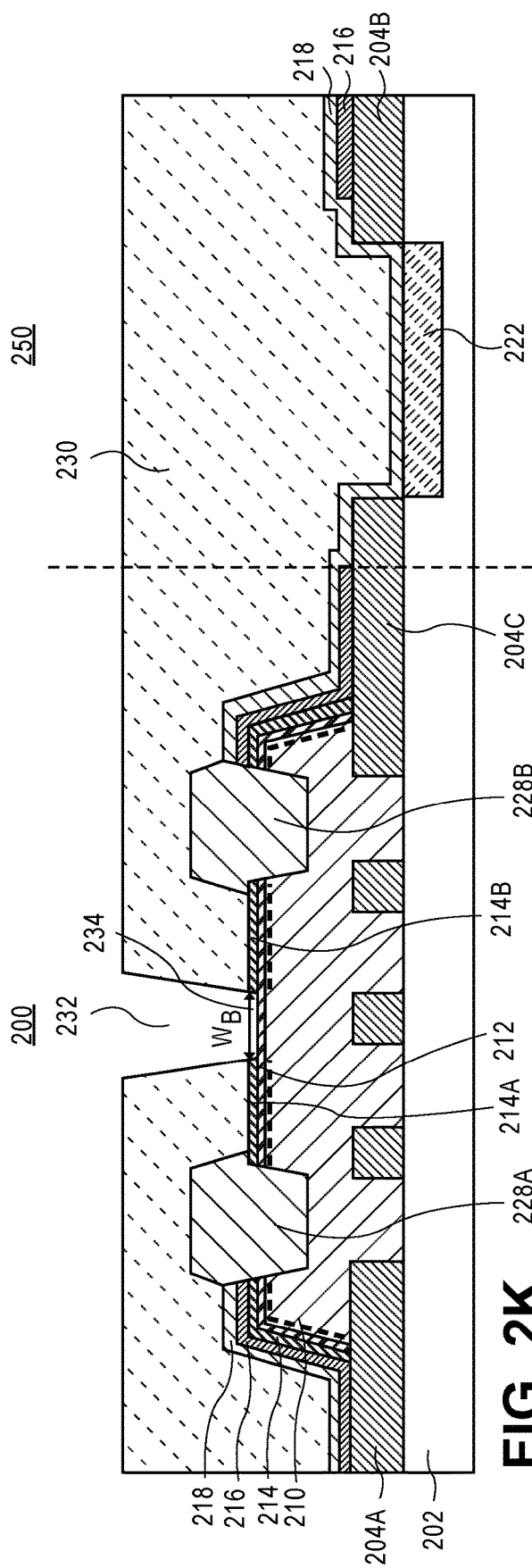

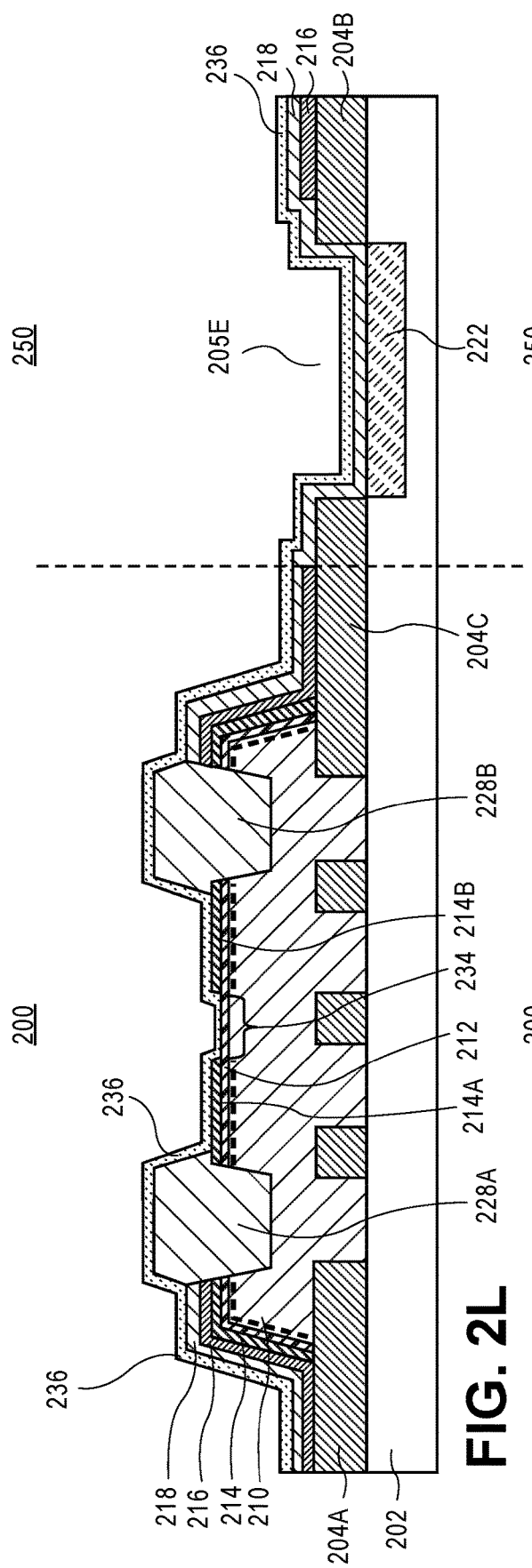
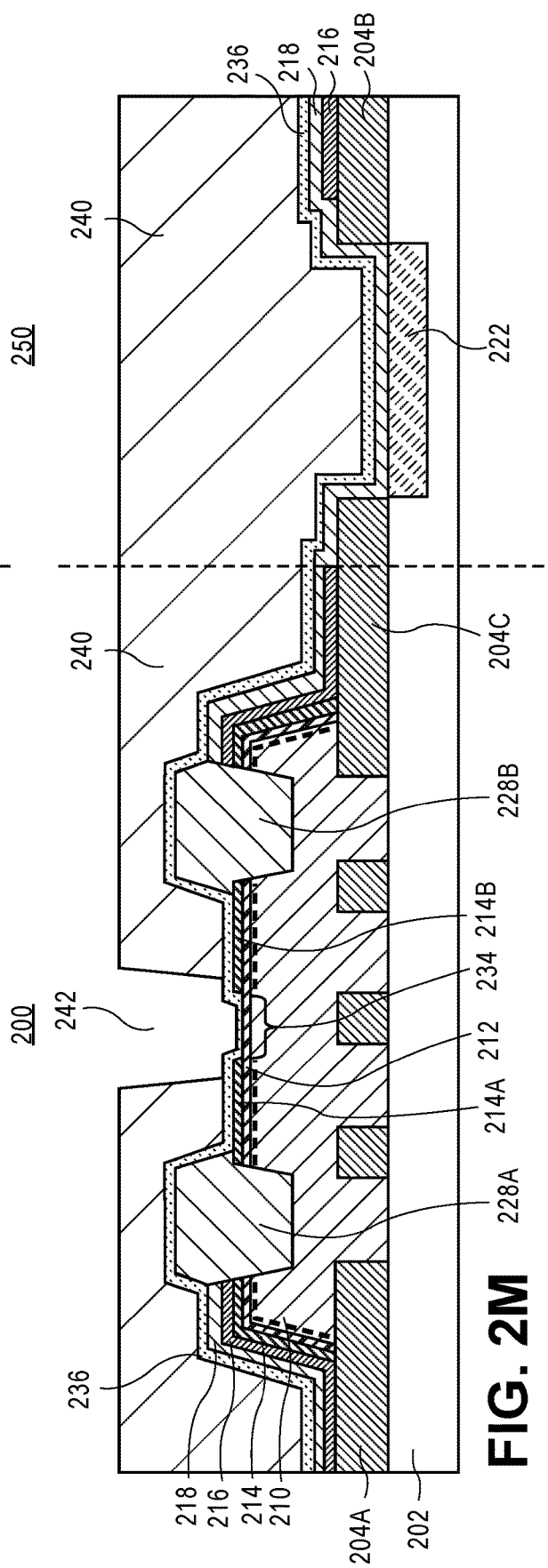

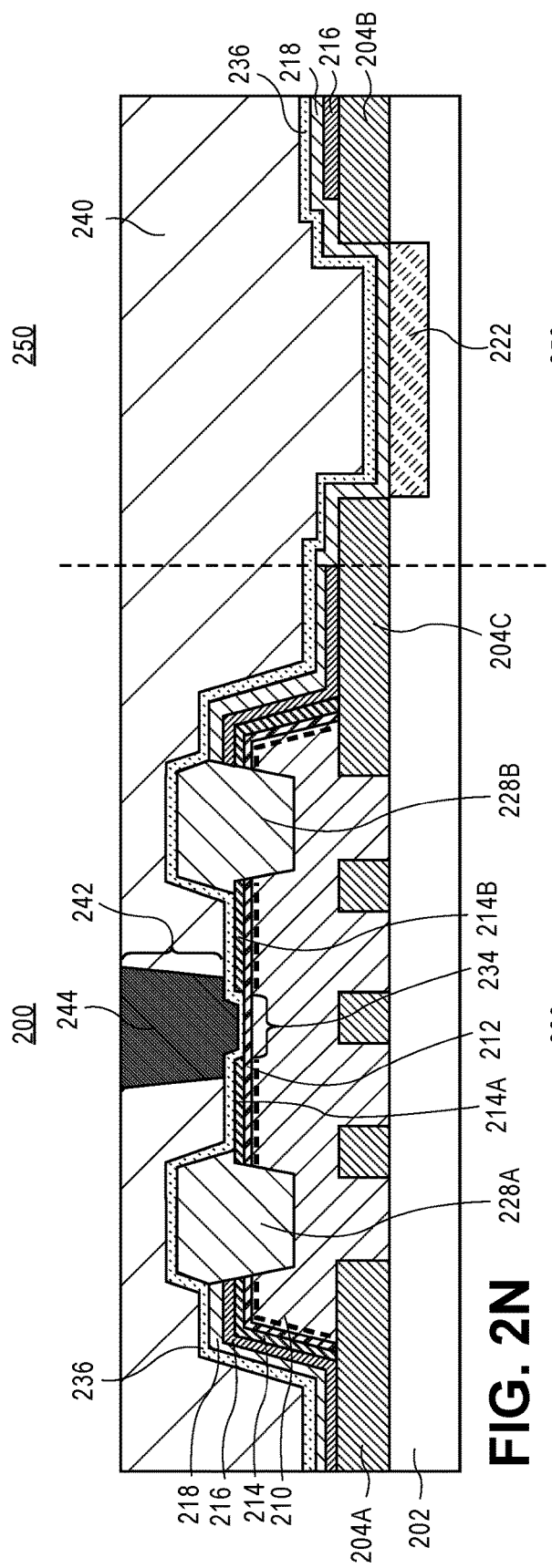
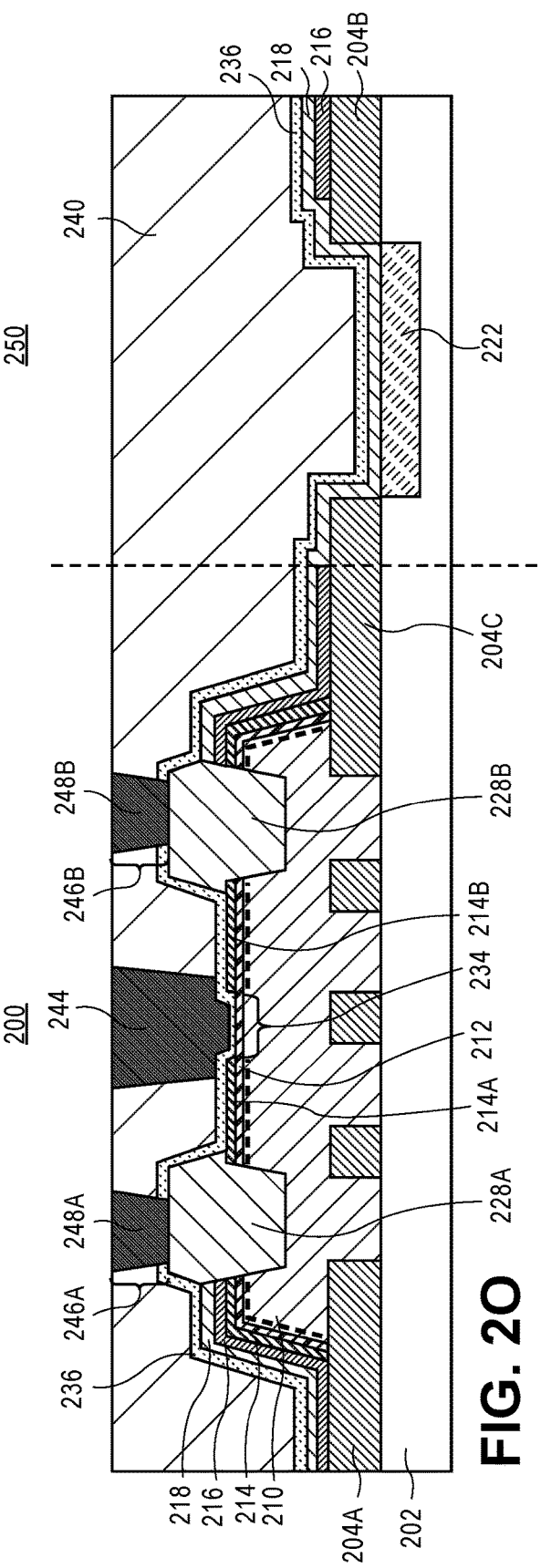
FIG. 2N
FIG. 2O

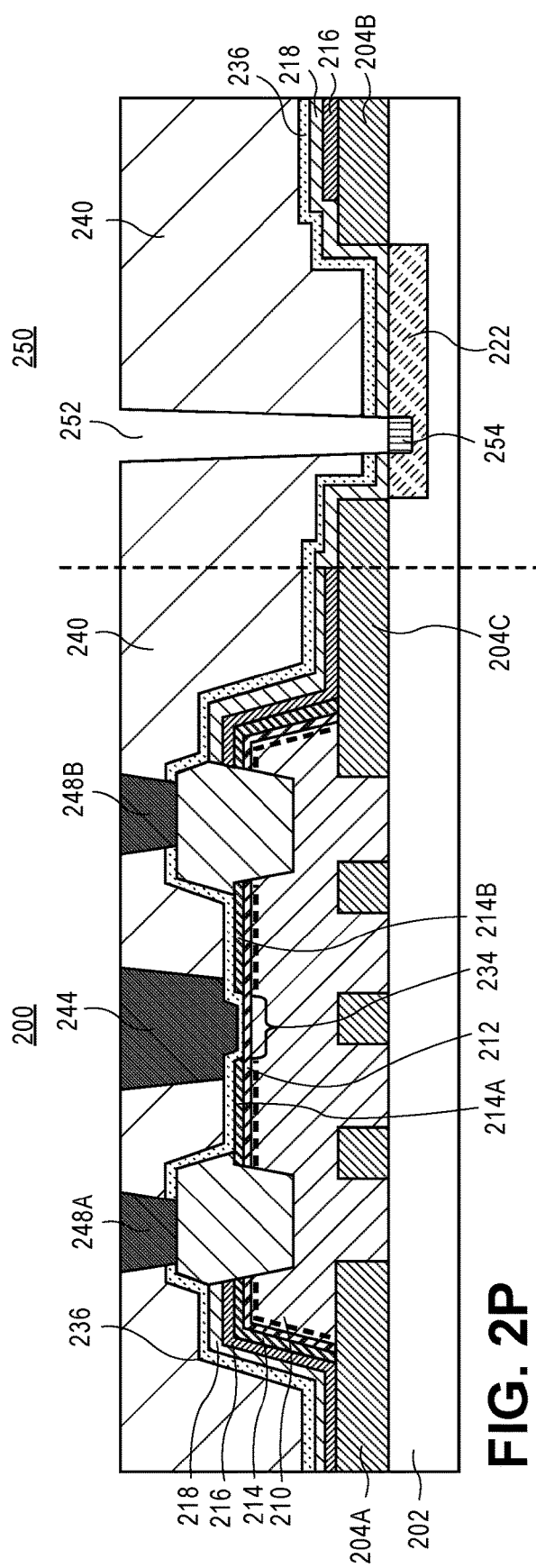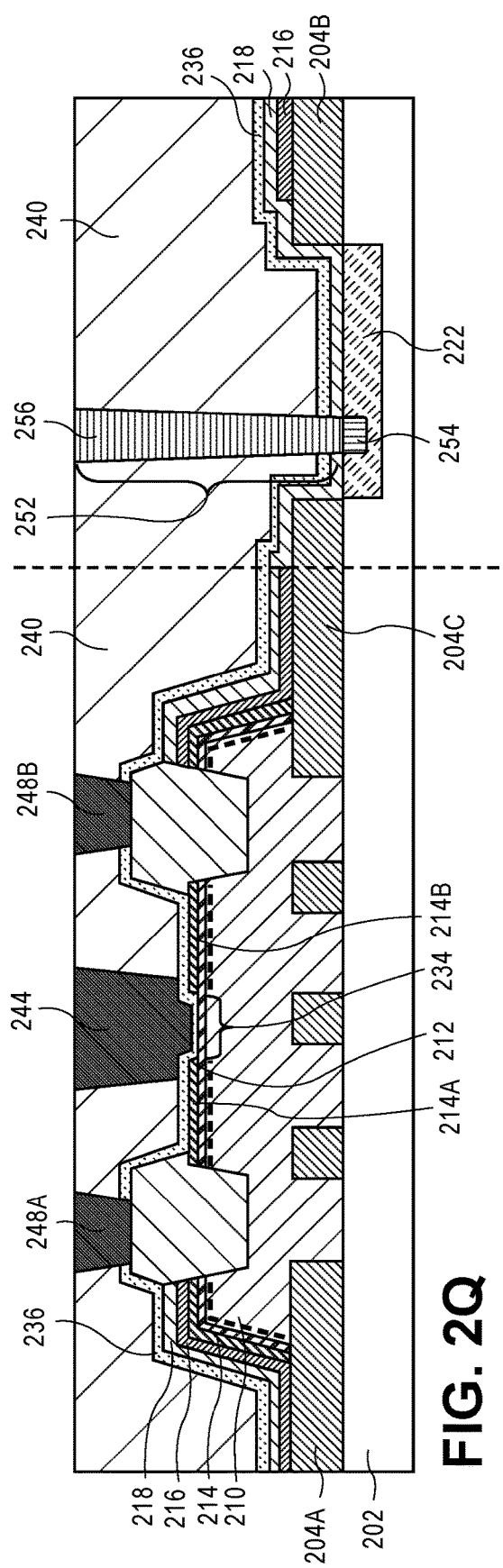

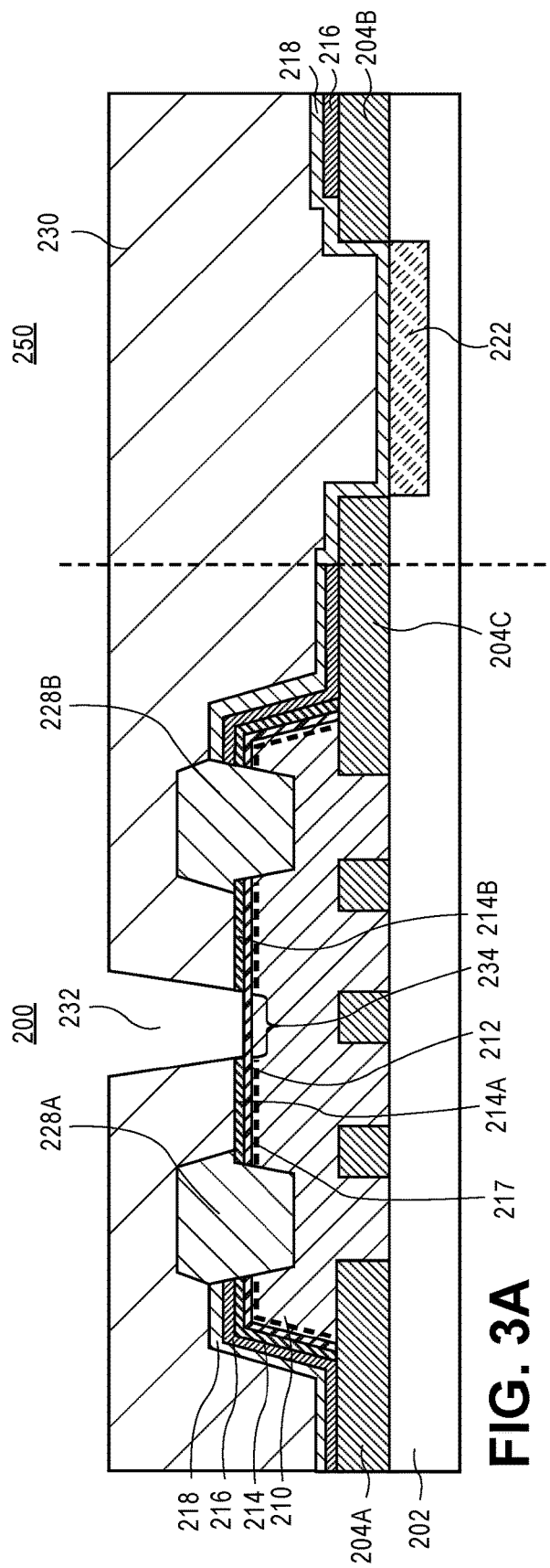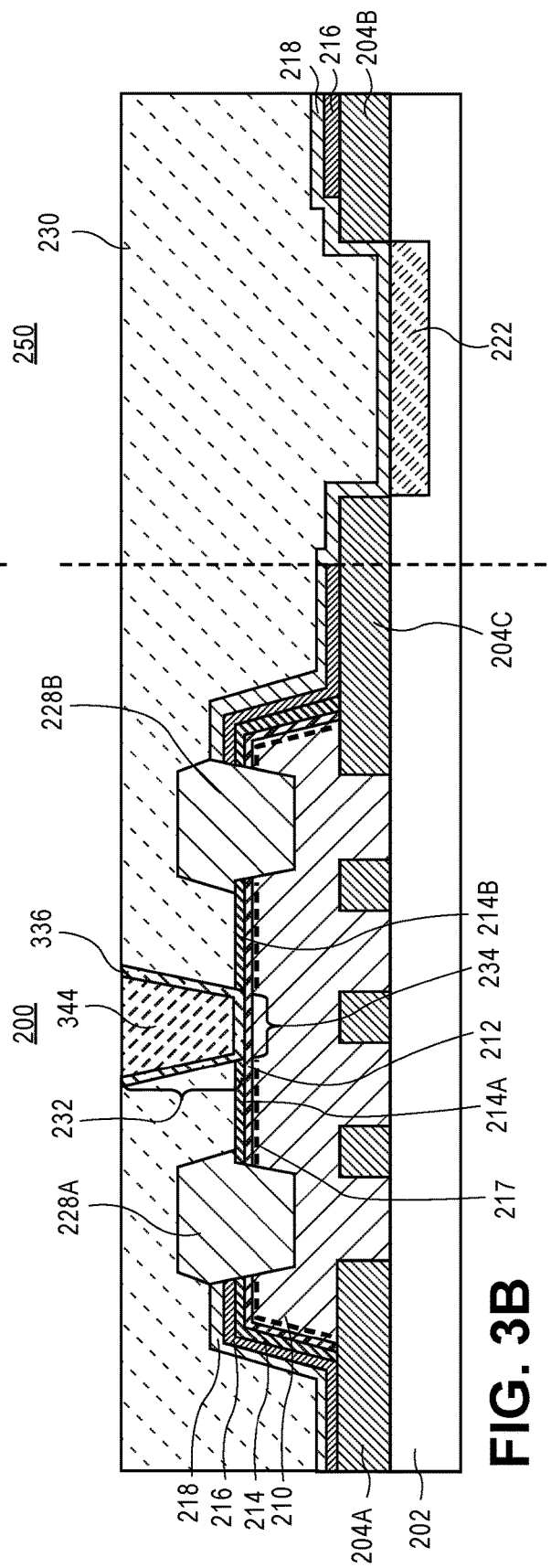

PN DIODES AND CONNECTED GROUP III-N DEVICES AND THEIR METHODS OF FABRICATION

CROSS-REFERENCE TO RELATED APPLICATION

This patent application is a U.S. National Phase Application under 35 U.S.C. § 371 of International Application No. PCT/US2016/055008, filed Sep. 30, 2016, entitled "PN DIODES AND CONNECTED GROUP III-N DEVICES AND THEIR METHODS OF FABRICATION," which designates the United States of America, the entire disclosure of which is hereby incorporated by reference in its entirety and for all purposes.

TECHNICAL FIELD

Embodiments of the present invention generally relate to microelectronic devices and their methods of fabrication, and more particularly to co-integration of PN diode and group III-N transistor structures and design.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-N semiconductor materials are suited for integrated circuits for applications such as high-frequency and high-power. However, the transistor gates in particular, may be susceptible to damage due to process-induced charging during the manufacturing process, due to electrostatic discharge (ESD) events that occurs during packaging and during normal use. Reliable manufacturing processes that produce such integrated circuits may require some form of electrostatic discharge (ESD) protection to prevent component damage. One form of ESD protection can be obtained by fabrication of a diode connected to a transistor or multiple diodes connected to a single or multiple transistors.

BRIEF DESCRIPTION OF THE DRAWINGS

FIGS. 2A-2S illustrate cross-sectional views representing various operations in a method of fabricating a PN diode and a group III-N transistor in accordance with embodiments of the present invention.

FIG. 2A illustrates the formation of a plurality of trenches in a first insulator layer formed above a substrate.

FIG. 2B illustrates the structure of FIG. 2A, following the formation of a first dielectric layer formed in the plurality of trenches on the substrate.

FIG. 2C illustrates the structure of FIG. 2B, following the formation of a masking layer on the first dielectric layer in the PN diode region and the removal of the second dielectric layer in the group III-N transistor region.

FIG. 2D illustrates the structure of FIG. 2C, following the formation of a group III-N semiconductor material on the substrate, the formation of a mobility enhancement layer on the group III-N semiconductor, and the formation of a polarization charge inducing layer material on the mobility enhancement layer.

FIG. 2E illustrates the structure of FIG. 2D, following the formation of a first insulator layer on the polarization charge inducing layer in the group III-N transistor region.

FIG. 2F illustrates the structure of FIG. 2E, following the removal of the first dielectric layer from the PN diode region and formation of a well in the PN diode region.

FIG. 2G illustrates the structure of FIG. 2F, following the blanket formation of a second insulator layer.

FIG. 2H illustrates the structure of FIG. 2G, following the formation of an opening to expose a portion of the polarization charge inducing layer in the group III-N transistor region.

FIG. 2I illustrates the structure of FIG. 2H, following the formation of source-drain trenches in the polarization charge inducing layer, the mobility enhancement layer and the group III-N semiconductor material in the group III-N transistor region.

FIG. 2J illustrates the structure of FIG. 2I, following the formation of a raised drain structure and a raised source structure in the group III-N semiconductor material in the group III-N transistor region.

FIG. 2K illustrates the structure of FIG. 2J, following the formation of a gap in the polarization charge inducing layer in the group III-N transistor region.

FIG. 2L illustrates the structure of FIG. 2K, following the formation of a gate dielectric layer in the gap polarization charge inducing layer of the group III-N transistor region and on the PN diode region.

FIG. 2M illustrates the structure of FIG. 2L, followed by the formation of a first opening in a second dielectric layer to expose the gate dielectric layer above the gap in the group III-N transistor region.

FIG. 2N illustrates the structure of FIG. 2M, following the formation of a gate electrode in the first opening in the second dielectric layer in the group III-N transistor region.

FIG. 2O illustrates the structure of FIG. 2N, following the formation of a source contact and a drain contact in the second opening and the third opening, respectively, in the group III-N transistor region.

FIG. 2P illustrates the structure of FIG. 2O, following the formation of a doped region opening in the second dielectric to expose the well in the PN diode region, followed by the formation of a doped region in the well region.

FIG. 2Q illustrates the structure of FIG. 2P, following the formation of a first electrode on the doped region in the PN diode region.

FIG. 2S illustrates the structure of FIG. 2R, following the formation of a second electrode on the well of the PN diode region.

FIGS. 3A-3C illustrate cross-sectional views representing various operations in a method of forming a gate dielectric layer and a gate electrode that is confined to a gap in the polarization charge inducing layer.

FIG. 3A illustrates the structure of FIG. 2K following the formation of a gap in the polarization charge inducing layer in the group III-N transistor region.

FIG. 3B illustrates the structure of FIG. 3A, following the formation of a gate dielectric layer in the gap and a gate electrode on the gate dielectric layer in the group III-N transistor region.

FIG. 3C illustrates the structure of FIG. 3B, following the formation of contacts on the raised source structure and raised drain structure, and first and second electrodes on the doped region and well, respectively.

DESCRIPTION OF THE EMBODIMENTS

Figure 1:
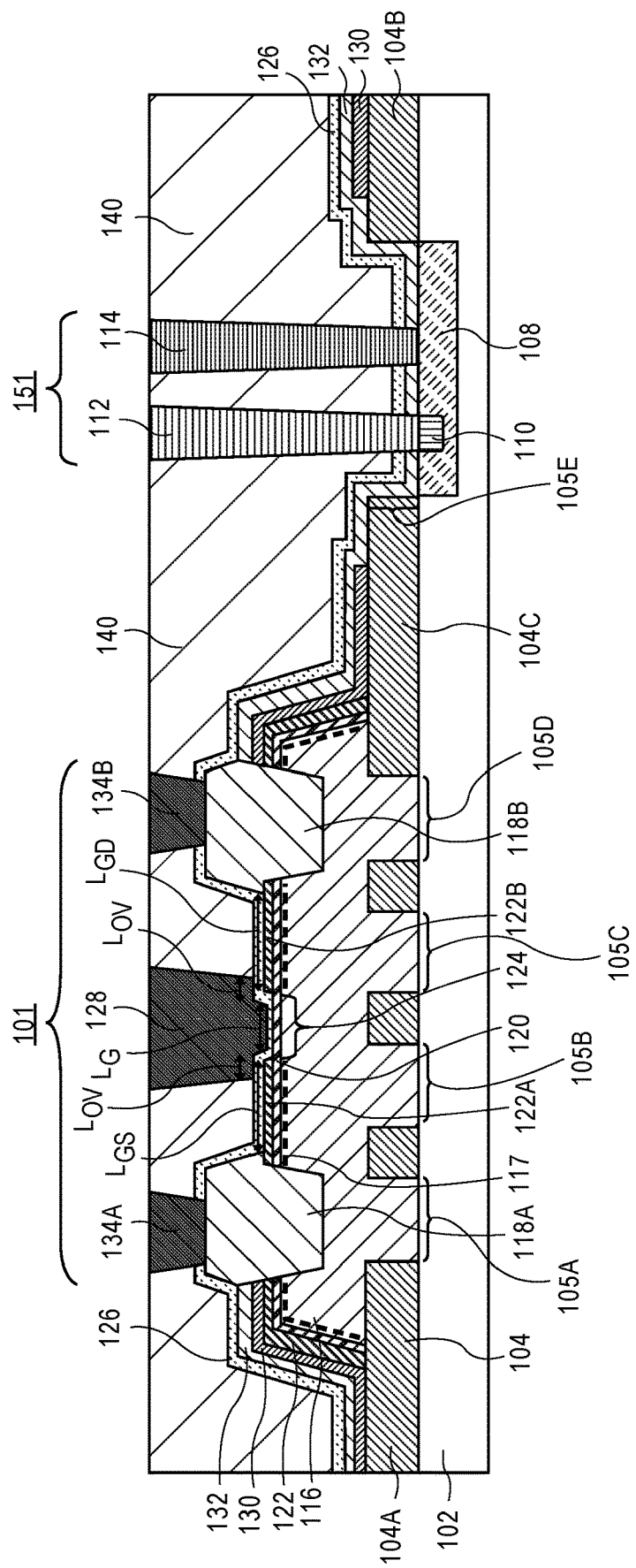
FIG. 1 illustrates a cross-sectional view of a PN diode and a group III-N transistor formed on a common substrate, in accordance with an embodiment of the present invention.

Diodes and group III-N transistors for logic, system-on-chip (SoC), radio frequency (RF) components and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as operations associated with group III-N transistor, are described in lesser detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Electrostatic discharge (ESD) is one of the most prevalent threats to electronic components. In an ESD event, a large amount of charge is transferred during the fabrication process to a component of a microchip (e.g. transistor, capacitor etc.) or during use of an already fabricated SoC device. The ESD event can lead to large amounts of current to pass through the components of a microchip within a very short period of time. Large amounts of uncontrolled current can cause device degradation and in some cases render the device dysfunctional. Thus, designing and integrating structures to protect integrated circuits against ESD events is an important component of the semiconductor device fabrication process. The problem of ESD becomes even greater when the substrate utilized to build the electronic components cannot discharge the extra charge adequately. Floating substrates such as SOI or silicon on insulator are especially prone to destruction caused by ESD events. An intrinsic group III-N semiconductor material may be comparable to SOI substrates because of the ability to withstand high dielectric breakdown. In this regard, an electronic device such as a group III-N transistor fabricated on an intrinsic group III-N semiconductor material may require additional components for protection against ESD events. A semiconductor device such as a silicon diode can be readily integrated into the circuitry and may help protect components such as a group III-N transistor. Integration schemes that can co-fabricate a group III-N transistor alongside a diode on a common silicon substrate can offer ESD protection, provide significant process advantages and potentially offer cost benefits.

In an embodiment, a semiconductor structure includes a group III-N semiconductor material disposed on a silicon substrate. A group III-N transistor structure is fabricated on the group III-N semiconductor material. A well is disposed in the silicon substrate. The well has a first conductivity type. A doped region is disposed in the well. The doped region has a second conductivity type that is opposite to the first conductivity type of the well. A first electrode is connected to the doped region having a second conductivity type and a second electrode is connected to the well having a first conductivity type. The well and the doped region form a PN diode. In an embodiment, the PN diode is connected to the group III-N transistor.

FIG. 1 illustrates a cross-sectional view of a semiconductor structure including a PN diode 151 formed on a silicon substrate 102 and a group III-N transistor 100 formed in a group III-N semiconductor material disposed on the silicon substrate 102 in accordance with an embodiment of the present invention. In an embodiment, a patterned insulator layer 104 is disposed on the silicon substrate 102. The patterned insulator layer 104 has a plurality of openings 105A, 105B, 105C, 105D and 105E. The PN diode 151 has a well 108 of a first conductivity type that is disposed on the silicon substrate 102 in the opening 105E of the patterned insulator layer 104. A doped region 110 having a second conductivity type is disposed in the well of the first conductivity type 108 in the opening 105E of the patterned insulator layer 104. A first electrode 112 is connected to well of the second conductivity type 110 and a second electrode 114 is connected to the well 108 of the first conductivity type of the PN diode 151.

In an embodiment, the well 108 has a first conductivity associated with a p-type species and the doped region 110 has a second conductivity associated with an n-type species. In a different embodiment, the well 108 has a first conductivity type associated with an n-type species and the doped region 108 has a second conductivity type 110 associated with a p-type species.

The group III-N transistor structure 101 is fabricated on a group III-N semiconductor material 116 disposed on the silicon substrate. The group III-N transistor structure 101 is fabricated on a group III-N semiconductor material 116. The group III-N semiconductor material 116 is disposed on the silicon substrate 102 in the openings 105A, 105B, 105C, 105D in the patterned insulator layer 104 and on the patterned insulator layer 104. The group III-N transistor structure 101 includes a raised source structure 118A and a raised drain structure 118B disposed in the group III-N semiconductor material 116. A mobility enhancement layer 120 is disposed on the group III-N semiconductor material 116. A polarization charge inducing layer 122 is disposed on the mobility enhancement layer 116 between the raised source structure 118A and the raised drain structure 118B. The polarization charge inducing layer 122 has a first portion 122A and a second portion 122B that are separated by a gap 124. A gate dielectric layer 126 is disposed on the mobility enhancement layer 120 in the gap 124. A gate electrode 128 is disposed on the gate dielectric layer 126 above the gap 124 and between the raised source structure 118A and the raised drain structure 118B. A source contact 134A is disposed on the raised source structure 118A and a drain contact 134B is disposed on the raised drain structure 118B.

In an embodiment, the gate dielectric layer 126 is disposed on the first portion 122A and second portion 122B of the polarization charge inducing layer 122 as illustrated in FIG. 1. In an embodiment, gate dielectric layer 126 is also disposed on the sloped sidewalls and on the uppermost surface of the raised drain structure 118B. In an embodiment, the gate dielectric layer 126 is disposed on the sloped sidewalls and on the uppermost surface of the raised source structure 118A as shown in FIG. 1. In embodiment, the gate dielectric layer 126 is disposed in an opening in the dielectric layer 140 above the gap 124 and not on the first portion 122A and second portion 122B of the polarization charge inducing layer 122 or on the raised drain structure 118B or on the raised source structure 118A.

In an embodiment, the group III-N transistor 101 has a gate electrode 128 with portions that extend on opposite sides of the gap 124 by a distance $L_{OV}$. In one such embodiment, the gate electrode 128 overlaps with the polarization charge inducing layer 122. In an embodiment, the overlap distance $L_{OV}$, leads to stray gate capacitance. In an embodiment, an overlap of less than 10 nm can limit the stray gate capacitance to below 10%. The gate electrode 128 is distant from the raised drain structure 118B by a distance $L_{GD}$, denoted as a gate to drain separation distance. The gate electrode 128 is separated from the raised source structure 118A by a distance $L_{GS}$, denoted as a gate to source separation distance. In an embodiment, the distances $L_GD$ and $L_{GS}$ are of equal lengths as illustrated in FIG. 1. In other embodiments, the distance $L_{GS}$ is less than the distance $L_{GD}$. The distance $L_{GD}$, influences the breakdown voltage, $V_{BD}$ between the gate electrode 128 and the raised drain structure 118B. In an embodiment, an $L_{GD}$ of at least 100 nm enables the group III-N transistor 101 to have a breakdown voltage that is greater than 8V.

In the group III-N transistor an electric field, is created by biasing the gate electrode above a threshold voltage, $V_T$. When the gate voltage is equal to or greater than a threshold voltage, $V_T$, to form a channel in the group III-N semiconductor material 110, below the second gap 111B, current will flow from the second raised drain structure 118B to the raised source structure 118A.

In an embodiment, the polarization charge inducing layer 122 introduces a polarization difference in the top surface of the group III-N semiconductor material 116 leading to the formation of 2 dimensional electron gas (2DEG—represented by dashed lines 117) in the group III-N semiconductor material 116. The gap 124 in the polarization charge inducing layer 122 leads to an absence of 2DEG beneath the gap 124 in the group III-N semiconductor material 116. When positive bias voltage, greater or equal to the threshold voltage, $V_T$, is applied on the gate electrode 128, a channel is formed in the group III-N semiconductor material 116 below the gap 124, and current flows from the raised drain structure 118B to the raised source structure 118A.

In an embodiment, the patterned insulator layer 104 has a portion 104C that is disposed on the silicon substrate 102 between the group III-N transistor 101 and the PN diode 151 as is depicted in FIG. 1. In an embodiment, a masking layer 130 is disposed on portions of the patterned insulator layer 104A, 104C, 104B and on portions of the polarization charge inducing layer 122. In an embodiment, an insulator layer 132 is disposed on the portion 104C of the patterned insulator layer 104, disposed above the group III-N semiconductor material 116, and disposed on the uppermost surface of the well 108. In an embodiment, the gate dielectric layer 126 is disposed on the insulator layer 132, in the opening 105E, above the well 108.

In one embodiment, the well 108 includes a p-type dopant such as but not limited to boron, aluminum, nitrogen, gallium and indium and the doped region 110 includes an n-type dopant such as but not limited to phosphorus, arsenic, antimony, bismuth or lithium. In a different embodiment, the well 108 includes an n-type dopant such as but not limited to phosphorus, arsenic, antimony, bismuth or lithium and the doped region 110 includes a p-type dopant species such as but not limited to boron, aluminum, nitrogen, gallium and indium.

In an embodiment, the first metal electrode 112 and second metal electrode 114 of the PN diode 151, include suitable metals such as but not limited to Ni, Ti, Pt or W.

In an embodiment, the gate electrode 128 includes a work function layer such as but not limited to Pt, Ni, TiN or TaN. In an embodiment, the gate electrode 128 includes a gate cap metal on the work function layer. In one such embodiment, the gate cap metal is tungsten. In an embodiment, when the gate electrode 128 includes a work function layer and a gate cap metal, the work function layer has a thickness that is at least 20 nm.

In an embodiment, the gate dielectric layer 126 includes a gate dielectric material such as but not limited to $Al_2O_3$, $HfO_2$, $ZrO_2$, TiSiO, HfSiO or $Si_3N_4$. In an embodiment, the gate dielectric layer 126 has a thickness that is approximately in the range of 2 nm-10 nm. In an embodiment, the gate dielectric layer 126 is a composite stack including two separate and distinct layers of gate dielectric materials chosen from the above group of gate dielectric materials. In one such embodiment, a layer of gate dielectric material of one type is disposed on a layer of gate dielectric material of a different type.

Referring to FIG. 1, the group III-N semiconductor material 116 is disposed above a substrate. In an embodiment, the group III-N semiconductor material 116 is a GaN layer. In one such embodiment, the group III-N semiconductor material 116 has a relatively high carrier mobility, (greater than 500 $cm^2$ $V^{-1}$). In one such embodiment, the group III-N semiconductor material 116 is a substantially undoped group III-nitride material (i.e., $O_2$ impurity concentration minimized) for minimal impurity scattering. In other embodiments, group III-N semiconductor material 116 includes one or more ternary alloys of GaN, such as AlGaN, AlInN or InGaN or a quaternary alloy of GaN including at least one group III element and nitrogen, such as $In_xAl_yGa_{1-x-y}N$. where x ranges from 0.01-0.1 and y ranges from 0.01-0.1. In an embodiment, the group III-N semiconductor material 116 has a material thickness in the range of 100 nm to 5 microns.

Referring to FIG. 1, the mobility enhancement layer 120 is disposed on the group III-N semiconductor material 116. In an embodiment, the mobility enhancement layer 120 includes a group III-N semiconductor material such as but not limited to AlN, InAlN or AlGaN. In an embodiment, the mobility enhancement layer 120 has an insufficient thickness to form 2DEG in the group III-N semiconductor material 116. In an embodiment, the mobility enhancement layer 120 has a thickness that is less than 1 nm to prevent the introduction of polarization difference on the underlying group III-N semiconductor material 116. In an embodiment, the mobility enhancement layer 120 and the underlying group III-N semiconductor material 116 are binary alloys. In one such embodiment, where the mobility enhancement layer 120 and the underlying group III-N semiconductor material 116 are binary alloys there is reduced alloy scattering in the group III-N semiconductor material 116.

In an embodiment, the mobility enhancement layer 120 has a bandgap that is greater than the bandgap of the group III-N semiconductor material 116. In one such embodiment, a quantum well is formed below the interface between the mobility enhancement layer 120 and the group III-N semiconductor material 116. In an embodiment, the mobility enhancement layer 120 is an AlN layer and the underlying group III-N semiconductor material 116 is GaN. In one such embodiment, the presence of the quantum well and reduced alloy scattering enhances electron mobility in the GaN group III-N semiconductor material 116.

Referring again to FIG. 1, in an embodiment, the polarization charge inducing layer 122 includes a suitable group III-N material which induces polarization difference in the group III-N semiconductor material 116. The presence of the polarization difference leads to the formation of a 2DEG effect in the group III-N semiconductor material 116. In an embodiment, the polarization charge inducing layer 122 includes a polarization difference inducing material such as but not limited to $Al_ZGa_{1-Z}N$, or AlN, where Z ranges from 0.2-0.3 and W ranges from 0.7-0.85. In an embodiment, the polarization charge inducing layer 122 has a thickness greater than a minimum thickness needed to induce a sufficient polarization difference to form 2DEG in the uppermost portion of the group III-N semiconductor material 116. In one such embodiment, the polarization charge inducing layer 122 has a thickness that is approximately in the range of 3-20 nm. In an embodiment, the polarization charge inducing layer 122 is AlGaN and the group III-N semiconductor material 116 is GaN. In one such embodiment, the AlGaN polarization charge inducing layer 122 has a thickness that is approximately in the range of 3 nm-5 nm. In an embodiment, the mobility enhancement layer 120 is AlN, the polarization charge inducing layer 122 is AlGaN and the group III-N semiconductor material 116 is GaN. In one such embodiment, the AlN mobility enhancement layer 120 has a thickness that is less than 1.1 nm and the AlGaN polarization charge inducing layer 122 has a thickness that is in the range of 3 nm-5 nm.

In an embodiment, the raised source structure 118A and the raised drain structure 118B have uppermost surfaces that are above the level of the polarization charge inducing layer 122 and the insulator layer 132 as illustrated in FIG. 1. In an embodiment, the raised source structure 118A and the raised drain structure 118B include a group III-N semiconductor material such as but not limited to GaN or InGaN. In an embodiment, the raised source structure 118A and the raised drain structure 118B include a dopant that is an n-type dopant such as Si or Ge. In one such embodiment, the n-type dopant material is silicon. In an embodiment, the raised source structure 118A and the raised drain structure 118B have an n-dopant density of at least $1e19/cm^3$. In an embodiment, the raised source structure 118A and the raised drain structure 118B have a thickness that is approximately in the range of 100-200 nm and a width that is approximately 100 nm-200 nm. In an embodiment, a combination of the height and width of either the raised source structure 118A or the raised drain structure 118B and the n-type dopant density are chosen to have a contact resistance of 200 ohms-micron per side to realize a group III-N transistor 101 having a drive current of at least 1 mA/um. In an embodiment, each of the raised source structure 118A and the raised drain structure 118B has a contact resistance value that is less than 200 ohms-micron per side.

In an embodiment, the source contact 134A, and the drain contact 134B include metals such as but not limited to Ni, Ti, Pt or W. In one embodiment, the first metal electrode 112, the second metal electrode 114, and the source contact 134A, includes a metal layer including one of the above metals and a conductive cap. In one such embodiment, the conductive cap includes a conductive metal such tungsten or a conductive allow such as TiN.

In an embodiment, the PN diode 151 is electrically coupled to the group III-N transistor 101. In one such embodiment, the first or the second electrode 114 of the PN diode 151 is coupled to the raised drain structure 118B of group III-N transistor 101. In an embodiment, the PN diode 151 is electrically coupled with other PN diodes to form a PN diode array. Likewise, the group III-N transistor 101 may be electrically coupled with other the group III-N transistors to form an integrated circuit.

Figure 2R:
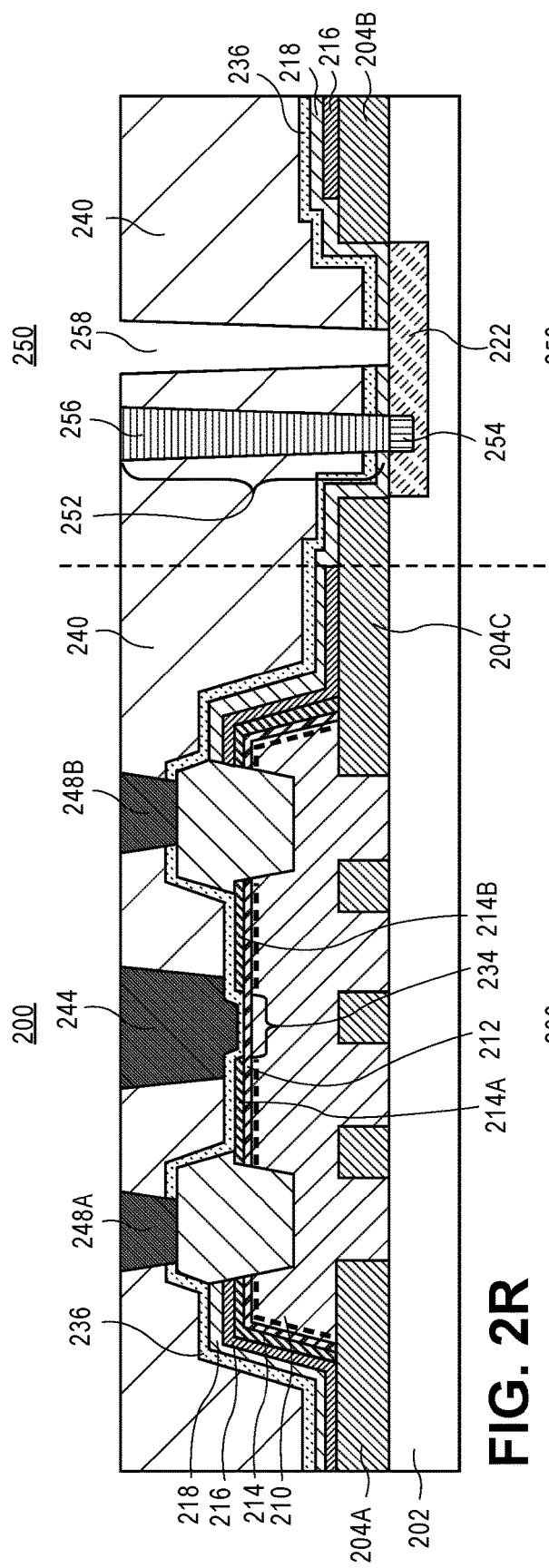
FIG. 2R illustrates the structure of FIG. 2Q, following the formation of a well opening in the second dielectric to expose the well in PN diode region.
Figure 2S:
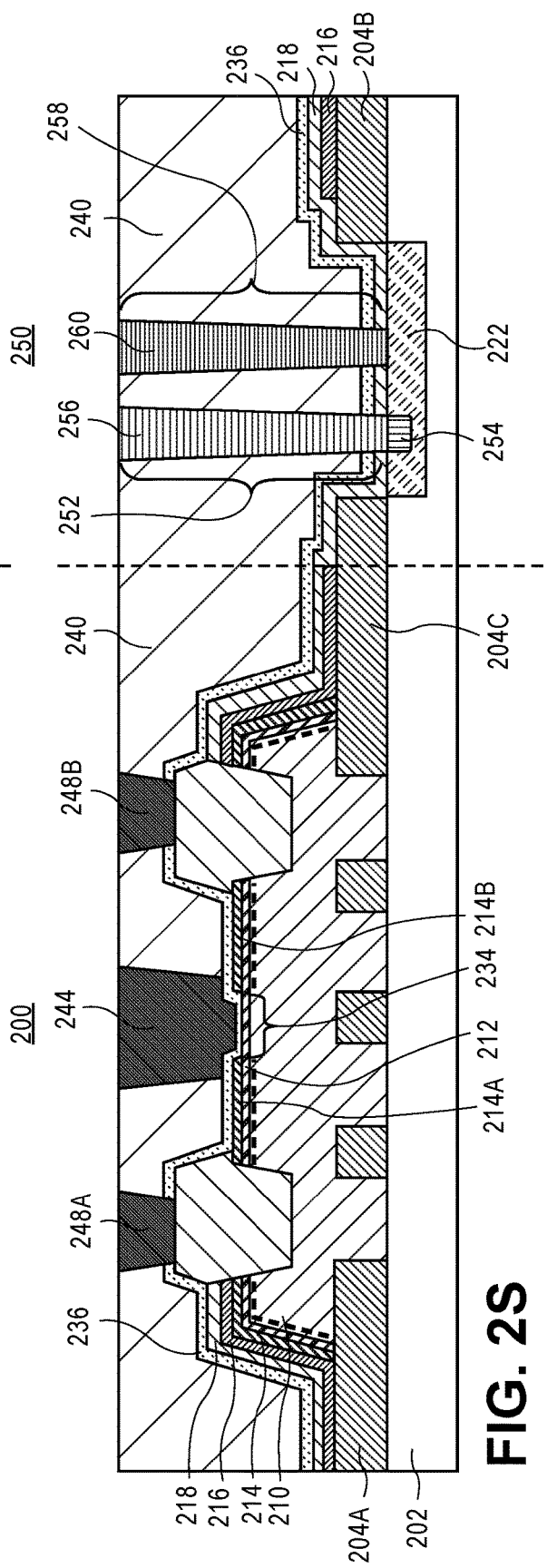

FIGS. 2A-2S illustrate cross-sectional views representing various operations in a method of fabricating a PN diode and a group III-N transistor in accordance with embodiments of the present invention.

FIG. 2A illustrates the formation of a plurality of openings 205A, 205B, 205C, 205D and 205E on a substrate 202 in an insulator layer 204. In an embodiment, the plurality of openings 205A, 205B, 205C, 205D and 205E are formed by a plasma etch process. In an embodiment, the openings 205A, 205B, 205C, 205D provide a location where a subsequent group III-N transistor of the type illustrated in FIG. 1 will be fabricated. In an embodiment, the opening 205E provides a location where a subsequent PN diode of the type illustrated in FIG. 1 will be fabricated.

In an embodiment, the substrate 202 includes a semiconductor material such as but not limited to silicon, silicon germanium (SiGe) or silicon carbide (SiC). In an embodiment, insulator layer 204 includes materials such as, but not limited to silicon dioxide ($SiO_2$), carbon doped oxide (CDO), silicon nitride. In an embodiment, insulator layer 204 is formed using a deposition technique such as but not limited to plasma enhanced chemical vapor deposition (PECVD), chemical vapor deposition (CVD) or vertical diffusion furnace (VDF). In an embodiment, insulator layer 204 has a thickness in the range of 50 nm-200 nm and each of the plurality of openings 205A, 205B, 205C, 205D and 205E have a width that is at least 100 nm.

FIG. 2B illustrates the structure of FIG. 2A, following the formation of a dielectric layer 206 on the substrate 202 in the plurality of openings 205A, 205B, 205C, 205D and 205E in the insulator layer 204. In an embodiment, the dielectric layer 206 is deposited on the substrate 202, on uppermost surface of the insulator layer 204 and fills the plurality of openings 205A, 205B, 205C, 205D and 205E. In an embodiment, the excess dielectric layer 206 on the uppermost surface of the insulator layer 204 is subsequently removed by a planarization process. The planarization process leaves portions of the dielectric layer 206 in each of the plurality of openings 205A, 205B, 205C, 205D and 205E.

FIG. 2C illustrates the structure of FIG. 2B, following the formation of a mask 207 to protect the dielectric layer 206 in a PN diode region 250 and following the exposure of a portion of the substrate 202 in a group III-N transistor region 200. Exposure of the substrate 202 enables formation of a group III-N semiconductor material 210 in the group III-N transistor region 200. In an embodiment, a masking layer is first deposited on the structure of FIG. 2B and is subsequently patterned to form a mask 207 over the portion of the dielectric layer 206 formed in the opening 205E, but does not cover the dielectric layer 206 formed in the plurality of openings 205A, 205B, 205C and 205D. In an embodiment, portions of the mask 207 extend over portions of the insulator layer 204C and 204B. In an embodiment, the mask 207 is a silicon nitride or a carbon doped silicon nitride and has a thickness in the range of 10 nm-15 nm. Subsequent to forming the mask 207, portions of the dielectric layer 206, not covered by the mask 207 are removed selectively with respect to the insulator layer 204 and with respect to the mask 207 by a wet etch process.

FIG. 2D illustrates the structure of FIG. 2C, following the formation of a group III-N semiconductor material 210 on the substrate 202, the formation of a mobility enhancement layer 212 on the group III-N semiconductor material 210 and the formation of a polarization charge inducing layer 214 on the mobility enhancement layer 212. In an embodiment, the group III-N semiconductor material 210 is formed on the substrate, in the plurality of openings 205A, 205B, 205C and 205D and on uppermost surfaces of the patterned insulator layer 204A and 204B in the group III-N transistor region 200. In an embodiment, group III-N semiconductor material 210 is formed using a metal organic chemical vapor deposition (MOCVD) process. In an embodiment, the group III-N semiconductor material 210 is grown by a MOCVD process at a temperature in the range of 1000-1100 degrees Celsius. The MOCVD process fills the plurality of openings 205A, 205B, 205C and 205D with the group III-N semiconductor material 210. The group III-N semiconductor material 210 also grows over the uppermost surfaces of the insulator layer 204, a process known as lateral epitaxial overgrowth (LEO). In an embodiment, the group III-N semiconductor material 210 is grown to have sidewalls 210A and 210B that are sloped, and an uppermost surface 210C that is substantially flat. In an embodiment, sloped sidewalls 210A and 210B each have a sidewall angle that is at least 50 degrees relative to the top surface of the insulator layer 204. In an embodiment, the group III-N semiconductor material 210 has a material composition such as is described above in association with group III-N semiconductor material 110. In an embodiment, the group III-N semiconductor material 210 is a GaN layer. In one such an embodiment, the sloped sidewalls 210A and 210B of the GaN group III-N semiconductor material 210 have a semipolar crystal plane (11-22) and the uppermost surface of the GaN layer 210C has a (110-1) orientation. In one such embodiment, a group III-N transistor is formed on the uppermost surface 210C having a (110-1) crystal plane orientation. In an embodiment, the GaN group III-N semiconductor material 210 is grown to a thickness that is approximately in the range of 100 nm-5 micrometers. In an embodiment, group III-N semiconductor material 210 has a defect density less than (1e10/cm2).

The mobility enhancement layer 212 is formed on the group III-N semiconductor material 210. In an embodiment, the mobility enhancement layer is formed by a MOCVD process. In an embodiment, the mobility enhancement layer 212 is grown by a MOCVD process at a temperature in the range of 1000-1100 degrees Celsius. In an embodiment, the MOCVD growth process leads to conformal growth of the mobility enhancement layer 212 on the sloped sidewalls 210A and 210B and on the uppermost surface 210C of the group III-N semiconductor material 210. In an embodiment, the mobility enhancement layer 212 is grown to have a thickness that is insufficient to induce polarization difference on the underlying group III-N semiconductor material 210. In an embodiment, the mobility enhancement layer 212 has a thickness that is approximately 1 nm or less. In other embodiments, the MOCVD growth condition does not result in a conformal growth of the mobility enhancement layer 212. In one such embodiment, the MOCVD growth process leads to a mobility enhancement layer 212 having a thickness that is approximately 1 nm on the uppermost surface 210C of the group III-N semiconductor material 210 and a thickness that is in the range of 0 Angstroms-4 Angstroms on the sidewalls 210A and 210B of the group III-N semiconductor material 210. In an embodiment, the mobility enhancement layer includes a material such as but not limited to AlN, InAlN or AlGaN. In an embodiment, the mobility enhancement layer 212 is AlN. In an embodiment, the mobility enhancement layer 212 is AlN and has a thickness on the uppermost surface 210C of the group III-N semiconductor material 210, that is less than or equal to 1 nm.

The polarization charge inducing layer 214 is formed on the mobility enhancement layer 212. In an embodiment, polarization charge inducing layer 214 is formed using a MOCVD process. In an embodiment, the polarization charge inducing layer 214 is grown by a MOCVD process at a temperature in the range of 1000-1100 degrees Celsius. In an embodiment, the MOCVD growth process leads to conformal growth of the polarization charge inducing layer 214 on the mobility enhancement layer 212. In an embodiment, the polarization charge inducing layer 214 includes a material such as but not limited to AlN, AlInN or $Al_yGa_{1-y}N$ (where y is 0.24-0.36) and the group III-N semiconductor material includes a material such as but not limited to InGaN or GaN. In an embodiment, the polarization charge inducing layer has a thickness that ranges from 3 nm-20 nm. In an embodiment, the polarization charge inducing layer 214 is AlInN. In an embodiment, the polarization charge inducing layer 214 is AlInN and has a thickness that ranges from 3 nm-10 nm. In an embodiment, the presence of a polarization charge inducing layer 214 induces a polarization difference below the surface of mobility enhancement layer 212 and in the uppermost portion of the group III-N semiconductor material 210. The presence of sufficient polarization difference in the group III-N semiconductor material 210 leads to formation of 2DEG in the uppermost portion of the group III-N semiconductor material 210. In an embodiment, the group III-N semiconductor material 210, the mobility enhancement layer 212 and the polarization charge inducing layer 214 are sequentially grown in a single process introduction in an MOCVD growth chamber without breaking vacuum.

FIG. 2E illustrates the structure of FIG. 2D, following the formation of a second masking layer 216 on the polarization charge inducing layer 214 and on portions of the patterned insulator layer 204. In an embodiment, the second masking layer 216 is formed to protect the polarization charge inducing layer 214 during a subsequent well fabrication process involving implanting with high energy ions. In an embodiment, a second masking layer 216 is blanket deposited over the polarization charge inducing layer 214, on portions of the patterned insulator layer 204 and on the mask 207. In an embodiment, a portion of the second masking layer 216 in the PN diode region 250, along with the mask 207 are subsequently removed by a plasma etch process. Removal of the mask 207 exposes the dielectric layer 206A in the opening 205E and portions of the insulator layer 204B and 204C. In an embodiment, suitable materials for forming the second masking layer 216 include materials such as, but not limited to silicon nitride ($Si_3N_4$), carbon doped silicon nitride (CDN) and silicon oxynitride. In an embodiment, the second masking layer 216 has a thickness that is in the range of 10 nm-100 nm.

FIG. 2F illustrates the structure of FIG. 2E, following removal of the dielectric layer 206 and formation of a well 222 in the PN diode region 250. The process of forming the well 222 takes place after a prolonged high temperature process of forming the group III-N semiconductor material 210, the mobility enhancement layer 212 and the polarization charge inducing layer 214. If the well 222 is subjected to high temperature processing, in the range of 900-1100 degrees Celsius, for a prolonged time period ranging from 5-10 min, undesirable effects such as well broadening and reduction in dopant concentration (due to well broadening) may result, subsequently leading to formation of dysfunctional PN diodes.

In an embodiment, the dielectric layer 206 is removed by a wet etch process selectively to the masking layer 216, portions of the insulator layer 204B and 204C and to the underlying substrate 202. Removal of the dielectric layer 206 leads to, exposure of the underlying substrate 202 in the opening 205E, herein, referred to as a well opening 205E. In an embodiment, the dielectric layer 206 is a silicon dioxide material, and the second masking layer 216 and the insulator layer 204 are composed of silicon nitrides. In one such embodiment, the dielectric layer 206 is removed by a solution containing hydrofluoric acid and water with little to no damage to the underlying substrate 202 where well 222 is to be formed.

In a subsequent operation, the portion of the silicon substrate 202 exposed by well opening 205 is subjected to dopant implant. In an embodiment, the dopants include n-type impurities or p-type impurities. In an embodiment p-type dopants include impurity species such as but not limited to boron, aluminum, nitrogen, gallium and indium. In an embodiment n-type dopants include impurity species such as but not limited to phosphorus, arsenic, antimony, bismuth or lithium. In an embodiment, the n or p-type dopants are implanted into a silicon substrate 202 using an ion implanter. In an embodiment, the n or p-type dopants are implanted into the silicon substrate 202 to a concentration level between $1e19/cm^3$-$5e20/cm^3$. In an embodiment, the dopants are subsequently activated by a process of high temperature anneal to form a well 222 having an n-conductivity type or a p-conductivity type. In an embodiment, the high temperature anneal process causes further diffusion of the dopant species in the substrate 202 by a distance ranging from 10-20 nm laterally and an approximately equal distance vertically into the substrate 202 beyond the initial spatial extent of the well 222 (as indicated by dashed line 223). In an embodiment, the high temperature anneal is carried out using a rapid thermal process (RTP) at a process temperature ranging from 500-1500 degrees Celsius and for a time duration ranging from 50 s-100 s. In an embodiment, the RTP is performed in an ambient including one or more combination of gases such as but not limited to $H_2$, $N_2$, $O_2$. In an embodiment, the annealing process is carried out after forming a second insulator layer as will be discussed below.

FIG. 2G illustrates the structure of FIG. 2F, following the blanket formation of a second insulator layer 218 in the group III-N transistor region 200 and in the PN diode region 250. In an embodiment, the second insulator layer 218 is deposited conformally on the second masking layer 216 in the group III-N transistor region 200, on the insulator layer 204B and 204C of the patterned insulator layer 204 and on the well 222 in the PN diode region 250. In an embodiment, the second insulator layer 218 protects the well 222 from subsequent group III-N transistor fabrication process operations such as e.g. during etching of a trench to expose the well as described with respect to FIG. 2P. In an embodiment, the second insulator layer 218 includes materials such as, but not limited to silicon dioxide ($SiO_2$), carbon doped oxide (CDO) or silicon oxynitride. In an embodiment, the second insulator layer 218 has a thickness that is in the range of 10 nm-100 nm.

In an embodiment, the RTA anneal process can be carried out after formation of the second insulator layer 218. The presence of the second insulator layer 218 can help to prevent out diffusion of the dopant species during the anneal process.

FIG. 2H illustrates the structure of FIG. 2G, following the formation of a transistor opening 219 in the second insulator layer 218 and the second masking layer 216 to expose a portion of the polarization charge inducing layer 214 in the group III-N transistor region 200. In an embodiment, a transistor opening 219 is formed in the second insulator layer 218 and in the masking layer 216 and by a plasma etch process. The transistor opening 219 defines location for the subsequent formation of one or more group III-N transistors. The transistor opening 219 formed by the plasma etch process exposes a portion of the polarization charge inducing layer 214 that is above the uppermost surface 210C of the group III-N semiconductor material 210. In an embodiment, the second insulator layer 218 and the second masking layer 216 are etched selectively with respect to the underlying polarization charge inducing layer 214 by utilizing a plasma etch process. In one such embodiment, the second insulator layer 218 and the second masking layer 216 are etched by a plasma etch process that includes process gases such as but not limited to $CF_x$, $CH_xF_y$, CO, $O_2$, $N_2$ or Ar.

FIG. 2I illustrates the structure of FIG. 2H, following the formation of trench openings 226A and 226B in the polarization charge inducing layer 214, the mobility enhancement layer 212 and the group III-N semiconductor material 210 in the group III-N transistor region 200. The trench openings 226A and 226B expose the underlying group III-N semiconductor material 210 for ultimately forming raised source and raised drain structures, respectively. In an embodiment, a sacrificial layer 224 is first deposited on the structure of FIG. 2H. In an embodiment, the trench openings 226A and 226B are formed by a plasma etch process. In an embodiment, the plasma etch process has a first and a second etch portion. In an embodiment, the sacrificial layer 224 is plasma etched during the first portion of the etch process to expose a portion of the uppermost surface of the polarization charge inducing layer 214. Exposed portions of the polarization charge inducing layer 214, and the underlying mobility enhancement layer 212 and the underlying group III-N semiconductor material 210 are subsequently etched during the second portion of the plasma etch process. In an embodiment, the polarization charge inducing layer 214, the mobility enhancement layer 212 and the group III-N semiconductor material 210 are plasma etched with low to medium energy ions and radicals (<0.3 eV ion energy) to form trench openings 226A and 226B with tapered profiles, as illustrated in FIG. 3F. In other embodiments, the trench openings 226A and 226B are etched to have vertical profiles.

In an embodiment, subsequent to the formation of the trench openings 226A and 226B the sacrificial masking material 328 is removed.

FIG. 2J illustrates the structure of FIG. 2I, following the formation of a raised source structure 228A and a raised drain structure 228B in the group III-N semiconductor material 210 in the group III-N transistor region 200. In an embodiment, the raised source structure 228A and the raised drain structure 228B are grown using a metal organic chemical vapor deposition MOCVD process. In an embodiment, the raised source structure 228A and the raised drain structure 228B are grown by an MOCVD process at a temperature in the range of 1000-1100 degrees Celsius. In an embodiment, the raised source structure 228A and the raised drain structure 228B, are epitaxially grown sufficiently thick to fill trench openings 226A and 226B, respectively. In an embodiment, the raised source structure 228A and the raised drain structure 228B grow laterally and extend onto a portion of the insulator layer 218 and onto the uppermost surface of the exposed portions of the polarization charge inducing layer 214 as illustrated in FIG. 2J.

Exemplary materials and composition of the raised source structure 228A and raised drain structure 228B are as described above in association with raised source structure 118A and raised drain structure 118B. In an embodiment, the raised source structure 228A and raised drain structure 228B are n-doped InGaN. In an embodiment, raised source structure 228A and raised drain structure 228B are epitaxially grown to a thickness that is approximately in the range of 150-200 nm.

FIG. 2K illustrates the structure of FIG. 2J, following the formation of a gap 234 in the polarization charge inducing layer 214 between the raised drain structure 228B and the raised source structure 228A. In an embodiment, a sacrificial masking layer 230 is first deposited on the structure of FIG. 2J. In an embodiment, a gate opening 232 and the gap 234 are formed by a plasma etch process. In an embodiment, the sacrificial masking layer 230 is plasma etched during a first portion of the etch process to form the gate opening 232. In an embodiment, the exposed portions of the polarization charge inducing layer 214, is etched during a second portion of the plasma etch process to form the gap 234. In an embodiment, a portion of the underlying mobility enhancement layer 212 is exposed by forming the gap 234. In an embodiment, the polarization charge inducing layer 214 is separated into a first portion 214A and a second portion 214B of the polarization charge inducing layer 214 by formation of the gap 234. Furthermore, the absence of the polarization charge inducing layer 214 in the gap 234 leads to depletion of 2DEG from underneath the gap 234 (as indicated by the break in the dashed line 217 under the gap 234.)

In an embodiment, the polarization charge inducing layer 214 is AlGaN and the underlying mobility enhancement layer 212 is AlN. In one such embodiment, the AlGaN polarization charge inducing layer 214 is plasma etched selectively to the underlying AlN mobility enhancement layer 212, using process gases such as but not limited $SF_6$, $BCl_3$, $Cl_2$, Ar or $N_2$. In an embodiment, to ensure that a thin layer of AlN mobility enhancement layer 212 is not removed during the process of forming the gap 234, an etch selectivity of at least 10:1 is desirable, with the AlGaN polarization charge inducing layer 214 etching faster than the AlN mobility enhancement layer 212.

In an embodiment, the gap 234 has a width, at the bottom of the opening, $W_B$, that is approximately in the range of 30 nm-500 nm. In particular, the width, $W_B$, of the gap 234 defines an important transistor parameter known as the gate length or $L_G$. In an embodiment, the gap 234 is formed midway between the raised source structure 228A and the raised drain structure 228B. In other embodiments, the gap 234 is formed closer to the raised source structure 228A than to the raised drain structure 228B.

In an embodiment, a small portion of the polarization charge inducing layer 214 in the gap 234 is not removed by the plasma etching process. In one such embodiment, the underlying mobility enhancement layer 212 is not exposed by the gap 234. In one such embodiment, the remaining portions of the polarization charge inducing layer 214 has a thickness that is less than the thickness needed to induce 2DEG in the group III-N semiconductor material 210 under the gap 234. Depending on the plasma etch process parameters, the etch may (a) leave a uniformly thin layer of the polarization charge inducing layer 214 or (b) create a bowl-shaped profile in the polarization charge inducing layer 214.

Following the formation of the gap 234, the sacrificial masking layer 230 is removed from the group III-N transistor region 200 and the PN diode region 250. In other embodiments, the sacrificial masking layer 230 is a dielectric layer that remains for subsequent processing, as will be discussed with respect to FIGS. 3A-3C.

FIG. 2L illustrates the structure of FIG. 2K, following the formation of a gate dielectric layer 236 in the group III-N transistor region 200 and in the PN diode region 250. In an embodiment, the gate dielectric layer 236 is blanket deposited on the exposed portions of the mobility enhancement layer 212 in the gap 234, on the first 214A and second portions 214B polarization charge inducing layer 214, on the raised drain structure 228B and raised source structure 228A and on the upper surfaces of the second insulator layer 218 in the group III-N transistor region 200. In one such embodiment, the gate dielectric layer 236 is also formed on the portion of the second insulator layer 218 that is formed in the PN diode region 250. Suitable materials for the forming a gate dielectric layer 236 include dielectric materials such as but not limited to $Al_2O_3$, $HfO_2$, $ZrO_2$, TiSiO, HfSiO or $Si_3N_4$. In an embodiment, the gate dielectric layer 236, is formed by an atomic layer deposition (ALD) process. In an embodiment, the gate dielectric layer 326 has a thickness approximately in the range of 2 nm-10 nm.

FIG. 2M illustrates the structure of FIG. 2L, followed by the formation of a gate opening 242 in a second dielectric layer 240 to expose the gate dielectric layer 236 above the gap 234 in the group III-N transistor region 200. In an embodiment, the second dielectric layer 240 is first blanket deposited over the structure of FIG. 2L. In an embodiment, the gate opening 242 is formed in the second dielectric layer 240 by a plasma etch process. The gate opening 242 formed by the plasma etch process exposes a portion of the gate dielectric layer 236 above the gap 234. In an embodiment, exemplary materials, composition and methods of forming the second dielectric layer 240 are as described above in association with materials, composition and methods of forming the insulator layer 204.

In an alternative embodiment, the gate dielectric layer 236 is not subjected to ion bombardment effects arising from plasma etching of the second dielectric layer 240. Such an embodiment will be discussed with respect to FIGS. 3A-3C.

FIG. 2N illustrates the structure of FIG. 2M, following the formation of a gate electrode 246 on the gate dielectric layer 236 in the gate electrode opening 242 in the group III-N transistor region 200. In an embodiment, a work function layer 244 is deposited into and filling the gate opening 242 and on the uppermost surface of the second dielectric layer 240. In an embodiment, the work function layer 244 is deposited by a PVD or an ALD blanket deposition process. The ALD or PVD deposition process also deposits an excess amount of work function layer 244 on the surface of the second dielectric layer 240. In an embodiment, exemplary materials and composition of the gate electrode 246 are as described above for gate electrode 128. In an embodiment, the excess work function layer 244 is removed from an uppermost surface of the second dielectric layer 240 by a planarization process. In an embodiment, the planarization process includes a CMP process. In an embodiment, the CMP process leaves work function layer 244 in the gate opening 242 to form a gate electrode 244. In an embodiment, uppermost surfaces of the second dielectric layer 240 and gate electrode 246 are co-planar or substantially co-planar after the CMP process.

FIG. 2O illustrates the structure of FIG. 2N, following the formation of a source contact 248A on the raised source structure 228A and drain contact 248B on the raised drain structure 228B to form a III-N transistor 201. It is to be appreciated that while the gate electrode 246 was formed before formation of the source contact 248A and drain contact 248B, the order of formation may be reversed. In an embodiment, a source opening 246B and a drain opening 246B are formed in the second dielectric layer 240 and in the gate dielectric layer 236 by a plasma etch process. In an embodiment, a contact metal layer is deposited into and filling each of the source opening 246A and the drain opening 246B by a blanket PVD metal deposition process. An excess amount of contact metal layer is also deposited on the uppermost layer of the second dielectric layer 240 and on the uppermost surface of the gate electrode layer 244 by the blanket PVD metal deposition process. In an embodiment, the excess contact metal layer is polished back to form a source contact 248A on the raised source structure 228A and a drain contact 248B on the raised drain structure 228B. In an embodiment, suitable contact metals include metals such as but not limited to Ti, Al or Ni. In an embodiment, the source contact 248A and the drain contact 248B may include a contact metal layer capped by a layer of tungsten. In an embodiment, the source contact 248A and the drain contact 248B have a width that ranges from 50 nm-200 nm.

FIG. 2P illustrates the structure of FIG. 2O, following the formation of an opening 252 in second dielectric layer 240 to form a doped region 254 in the well 222. In an embodiment, the doped region 254 is formed after the formation of the gate electrode layer 244 as is depicted in FIG. 2P. However, the doped region 254 may be formed before formation of the gate electrode 244, the raised source contact 248A or the raised drain contact 248B.

In an embodiment, the opening 252 is formed in the second dielectric layer 240, in the gate dielectric layer 236 and in the second insulator layer 218 by a plasma etch process. The opening 252 exposes a portion of the already formed well 222. In an embodiment, the insulator layer 218 below the gate dielectric layer 236 acts as an etch stop during etching of the gate dielectric layer 236 and protects the underlying well 222 formed in the substrate 202. In an embodiment, the insulator layer 218 is plasma etched in a manner that minimizes damage to the underlying well 222. In an embodiment, the second insulator layer 218 is a silicon nitride, the well 222 is formed in a silicon substrate 202 and is implanted with n-type or p-type impurities. In one such embodiment, the second insulator layer 218 is etched by a plasma etch process that is selective to the underlying well 222 with a selectivity that is at least 20:1, with the second insulator layer 218 etching faster that the well 222. In an embodiment, the plasma etch process includes O2, N2, Ar, and fluorocarbons such as $CH_XF_Y$, $C_XF_Y$ and has ion energies of less than 0.5 eV.

In a subsequent operation, a portion of the well 222 exposed by the opening 252 is subjected to a dopant implant and an activation process to form a doped region 254. Dopant type and methods to dope and activate the dopants to form the doped region 254 are similar to the methods utilized to form well 222 described above. However, it is to be appreciated that in order to form a PN diode, the dopants utilized to form doped region 254 are of a conductivity type that is opposite to the conductivity type of the well 222. It is to be further appreciated that the resultant dopants injected to form the doped region 254 have a higher concentration as compared to the original dopant concentration in the well 222. A higher concentration ensures that the doped region 254 has a conductivity type that is opposite to the conductivity type of the well 222. In one embodiment, an n-doped region 254 is formed in a p-doped well 222. In a second embodiment a p-doped region 254 is formed in an n-doped well 222.

FIG. 2Q illustrates the structure of FIG. 2P, following the formation of a first electrode 256 on the doped region 254 in the PN diode region 250. A first electrode 256 is formed by a process similar to the process used to form source contact 248A and drain contact 248B described above. The metals suitable for formation of the first electrode 256 include metals such as but not limited to Ni, Ti, Pt or W. In an embodiment, the doped region 254 is formed in a silicon well 222. In an embodiment, after formation of the first electrode 256, a moderate to high temperature anneal process is carried out to form a metal salicide at the interface between the uppermost surface of the doped region 254 and the bottom of the first electrode 256. In an embodiment, the anneal is performed using a rapid thermal anneal process having a process temperature in the range of 300-950 degrees Celsius and a process time of approximately 30-45 seconds. In an embodiment, the metal silicide is formed below the electrode 256 to reduce the electrode resistance level below 30 ohms/square.

FIG. 2R illustrates the structure of FIG. 2Q, following the formation of a well opening 258 in the second dielectric layer, in the gate dielectric layer 236 and in the second insulator layer 218 to expose a portion of the well 222 in PN diode region 250. In an embodiment, the well opening 258 is formed by a method that is similar to the method utilized to form the opening 252 described above.

FIG. 2S illustrates the structure of FIG. 2R, following the formation of a second electrode 260 on the well 222 to complete fabrication of a PN diode 251. In an embodiment, the second electrode 260 is formed using materials and methods that are similar to the materials and methods utilized to form the first electrode 256 as described.

Figure 3C:
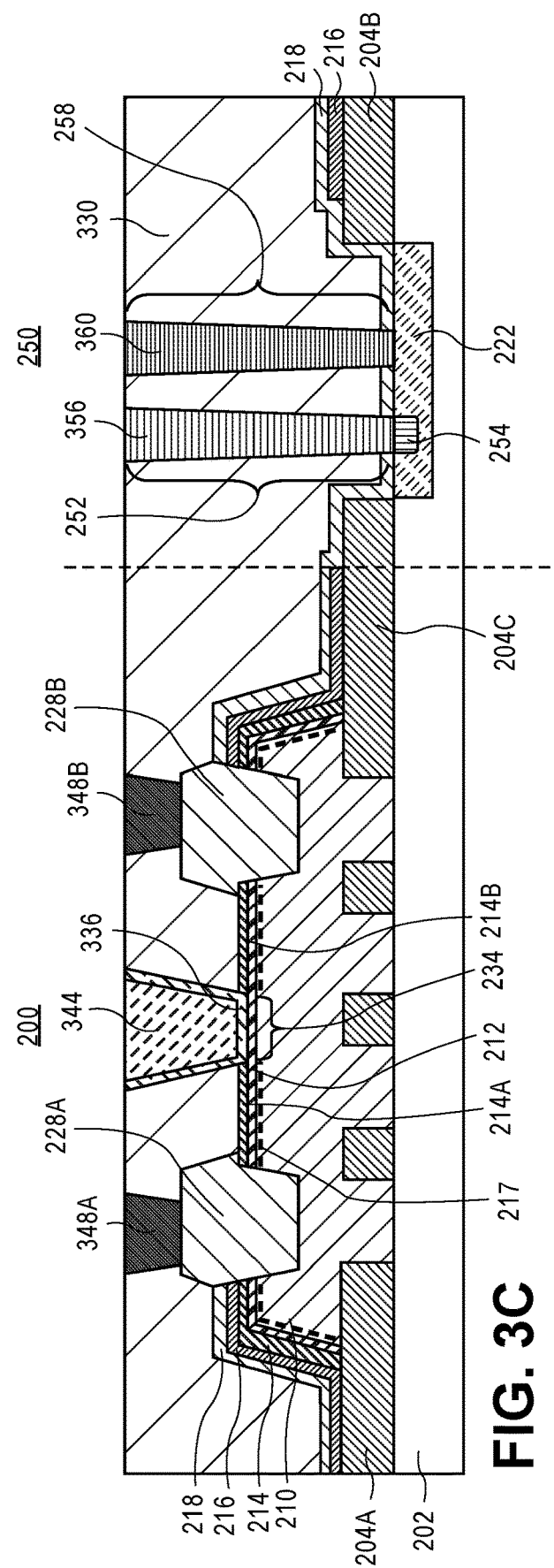

FIGS. 3A-3C illustrate a method of forming a gate dielectric layer 326 and a gate electrode 346 that is confined to the gap as opposed to being blanket deposited as illustrated in FIG. 2L.

FIG. 3A illustrates the structure of FIG. 2K, where the gap 234 in the polarization charge inducing layer 214, between the raised drain structure 228B and the raised source structure 228A, is formed using a dielectric layer 230. As compared to the sacrificial layer 230, the dielectric layer 230 is not removed after formation of the gap 234. In an embodiment, the gap 234 has features as described above in the various embodiments.

FIG. 3B illustrates the structure of FIG. 3A, following the formation of a gate dielectric layer 326 and gate electrode 346. In an embodiment, the gate dielectric layer 326 is formed in the gap 234, on the mobility enhancement layer 212, on sidewalls of the dielectric layer 230 exposed by the gate opening 232, and on the uppermost surface of the dielectric layer 230. In an embodiment, the gate dielectric layer is confined to an opening above the gap 234 and does not extend beyond the gap 234 on to the polarization charge inducing layer 214 or above the well 222 in the PN diode region 250. In an embodiment, the gate dielectric layer 326 is formed using materials and utilizing methods similar to materials and methods utilized to form gate dielectric layer 236.

A work function layer 344 is subsequently deposited on the gate dielectric layer 326 in the gate opening 232 and on the gate dielectric layer 326 formed on the uppermost surface of dielectric layer 230. It is to be appreciated that the gate dielectric layer 326 is not exposed to any ion bombardment effects arising from patterning a gate opening as described above with respect to FIG. 2M. In an embodiment, the work function layer 344 is deposited by a PVD or and an ALD process. In an embodiment, the work function layer 344 has a material composition similar to the material composition of the gate electrode layer 244.

In an embodiment, the excess work function layer 344 and the gate dielectric layer 326 formed on the uppermost surface of the dielectric layer 330 is removed by a planarization process. In an embodiment, the planarization process includes a CMP. In an embodiment, the CMP removes the work function layer 344 and the polish process continues to remove the gate dielectric layer 336 from the uppermost surface of the dielectric layer 330 form a gate electrode 346. In an embodiment, uppermost surfaces of the dielectric layer 330, the gate electrode 346 and the gate dielectric layer 326 are co-planar or substantially co-planar after the CMP process.

It is to be appreciated that in contrast to gate electrode 244, the gate electrode 346 does not extend over the first portion 214A or the second portion 214B of the polarization charge inducing layer 214, thus limiting any adverse impacts of stray gate capacitance due to $L_{OV}$, described in connection with FIG. 1.

FIG. 3C illustrates the structure of FIG. 3B, following the process to form a source contact 348A, a drain contact 348B, a doped region 254, a first electrode 356 and a second electrode 360. In an embodiment, the source contact 348A and drain contact 348B are formed using materials and methods similar to materials and methods utilized in forming source contact 248A and drain contact 248B. In an embodiment, the doped region 254, the first electrode 256, and the second electrode 260 are formed using a series of process operations similar to the process operations described in connection with FIGS. 2P-2S. In one embodiment, there is no gate dielectric layer 336 to etch above the second insulator layer 218, while forming well opening 258 and opening 252 to form the doped region 254.

Figure 4:
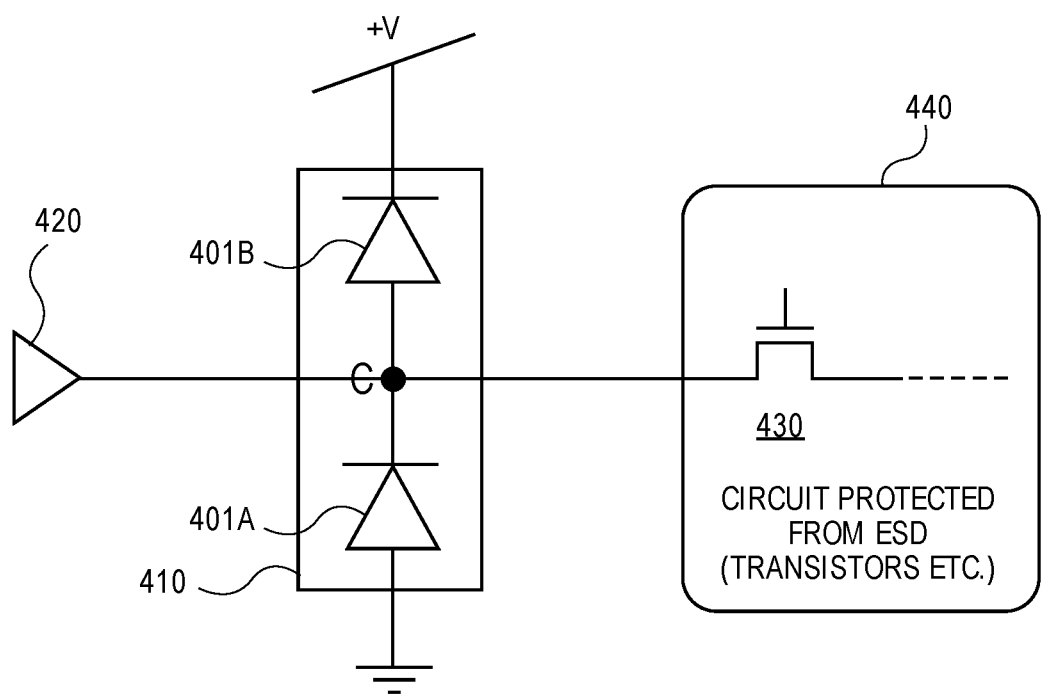
FIG. 4 illustrates a circuit layout demonstrating PN diodes connected between an ESD source and ESD protected circuit elements including a plurality of transistors.

FIG. 4 illustrates a circuit layout demonstrating PN diodes connected between an ESD source and circuit elements including transistors (or an array of transistor) that require ESD protection. In an embodiment, diodes 401A and 401B are connected in series as part of an ESD protection circuit 410. An anode of diode 401A is connected to ground and a cathode of diode 401B is connected to the positive rail (battery). A location for an ESD source 420, is connected to the cathode of diode 401A and anode of diode 401B (point C). In an embodiment, the location for an ESD source 420 is an antenna connected to the ESD protection circuit 410. The point C on the circuit 410 is also connected to a circuit element 440 that houses the circuit 430 needing protection from ESD events. The circuit element 440 may include semiconductor devices such as transistors in a circuit 430 or transistors and capacitors in a circuit 430. Diodes 401A and 401B provide low resistance current paths compared to the circuit element 440 and can conduct current very rapidly in an ESD event. Diode 401B is forward biased and diode 401A is reverse biased. During an ESD event, high current can flow in two directions. If an ESD event delivers a voltage with a positive polarity, diode 401B will provide a gateway for the charge to flow through to the battery terminals (+V). If the ESD event delivers a voltage with a negative polarity, then high current can flow from diode 401A to ground. Because diodes 401A and 401B provide low resistance paths when operational during an ESD event, depending on the voltage polarity, diodes 401A and 401B will divert the high current away from the circuit element 440, thus providing the internal components such as transistor 430 protection from an ESD event. In an embodiment, the circuit element 440 includes multiple transistors that are connected together to form functional circuits such as an amplifier. In one such embodiment, the drain contact of a transistor 430, is connected to point C on the diode circuit 410. In an ESD event, since the diode 401B provides a current path of less resistance as compared to the drain contact of transistor in circuit element 430, current will flow through the diode 401B, offering protection to the transistors. In an embodiment, diodes 401A and 401B include PN diodes such as PN diode 151 in accordance with an embodiment of the present invention. In an embodiment, the transistors in the circuit element 430 include a plurality of group III-N transistors such as group transistors 101 in accordance with an embodiment of the present invention.

Figure 5:
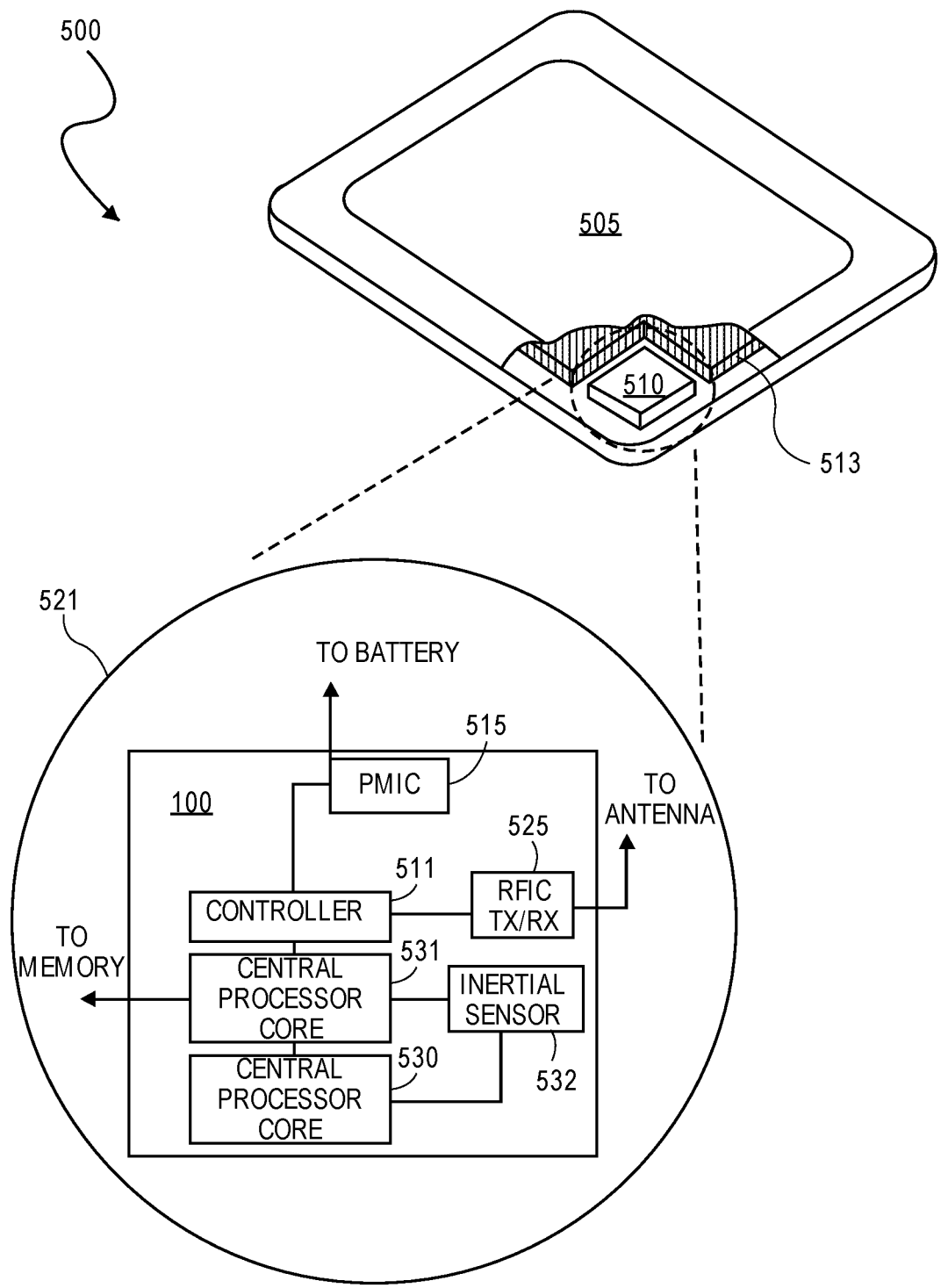
FIG. 5 is a functional block diagram of a group III-N SoC including PN diode with group III-N transistor of a mobile computing platform, in accordance with an embodiment of the present invention.

FIG. 5 is a functional block diagram of a group III-N SoC implementation of a mobile computing platform, in accordance with an embodiment of the present invention. The mobile computing platform 500 may be any portable device configured for each of electronic data display, electronic data processing, and wireless electronic data transmission. For example, mobile computing platform 500 may be any of a tablet, a smart phone, laptop computer, etc. And includes a display screen 505 that is in the exemplary embodiment a touchscreen (e.g., capacitive, inductive, resistive, etc.) permitting the receipt of user input, the SoC 510, and a battery 513. As illustrated, the greater the level of integration of the SoC 510, the more of the form factor within the mobile computing platform 500 that may be occupied by the battery 513 for longest operative lifetimes between charging, or occupied by memory (not depicted), such as a solid state drive, for greatest functionality.

Depending on its applications, mobile computing platform 500 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 510 is further illustrated in the expanded view 521. Depending on the embodiment, the SoC 510 includes a portion of a substrate 100 (i.e., a chip) upon which two or more of a power management integrated circuit (PMIC) 515, RF integrated circuit (RFIC) 525 including an RF transmitter and/or receiver, a controller 511 thereof, and one or more central processor core 530 and 531 and inertial sensor 532 is fabricated. The RFIC 525 may implement any of a number of wireless standards or protocols, including but not limited to Wi-Fi (IEEE 502.11 family), WiMAX (IEEE 502.16 family), IEEE 502.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 525 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 515 and RFIC 525. In embodiments of the present invention, the PMIC 515 and RFIC 525 employ one or more of the PN diodes and group III-N transistors as described herein (e.g., group III-nitride transistor 100). In further embodiments the PMIC 515 and RFIC 525 employing the PN diodes and group III-nitride transistors described herein are integrated with one or more of the controller 511 and processor cores 530, 531 provided in silicon CMOS technology monolithically integrated with the PMIC 515 and/or RFIC 525 onto the (silicon) substrate 101. It will be appreciated that within the PMIC 515 and/or RFIC 525, the high voltage, high frequency capable group III-nitride transistors described herein need not be utilized in exclusion to CMOS, but rather silicon CMOS may be further included in each of the PMIC 515 and RFIC 525.

The PN diodes and group III-nitride transistors described herein may be specifically utilized where a high voltage swings present (e.g., 8-10V battery power regulation, DC-to-DC conversion, etc. within the PMIC 515). As illustrated, in the exemplary embodiment the PMIC 515 has an input coupled to the battery 513 and has an output provide a current supply to all the other functional modules in the SoC 510. In a further embodiment, where additional ICs are provided within the mobile computing platform 500 but off the SoC 510, the PMIC 515 output further provides a current supply to all these additional ICs off the SoC 510. Particular embodiments of the group III-nitride transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-50% of chip area, embodiments of the PMIC implemented in the group III-nitride transistors described herein offer a significant shrink over other PMIC architectures.

As further illustrated, in the exemplary embodiment the PMIC 515 has an output coupled to an antenna and may further have an input coupled to a communication module on the SoC 510, such as an RF analog and digital baseband module (not depicted). Alternatively, such communication modules may be provided on an IC off-chip from the SoC 510 and coupled into the SoC 510 for transmission. Depending on the group III-nitride materials utilized, the PN diodes and group III-nitride transistors described herein (e.g., PN diode 151 group III-N transistor 101) may further provide the large power added efficiency (PAE) needed from a power amplifier transistor having an $F_t$ of at least ten times carrier frequency (e.g., a 1.9 GHz in an RFIC 525 designed for 3G or GSM cellular communication).

Figure 6:
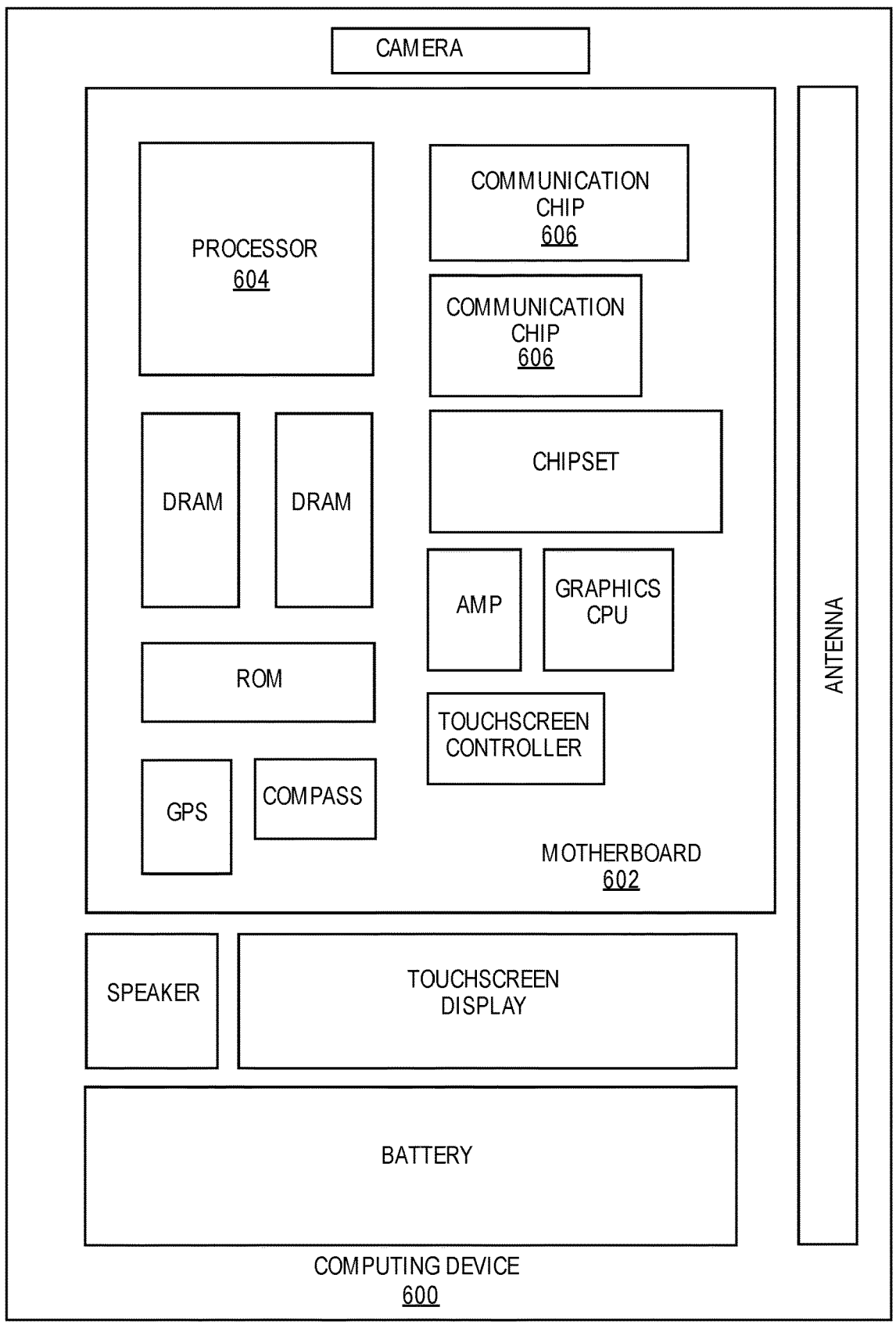
FIG. 6 illustrates a computing device in accordance with embodiments of the present invention.

FIG. 6 Illustrates an example computing device 600 implemented with the integrated circuit structures in accordance with some embodiments of the present disclosure. As can be seen, the computing device 600 houses a motherboard 602. The motherboard 602 may include a number of components, including, but not limited to, a processor 604 that includes PN diodes and group III-nitride transistors integrated with silicon CMOS transistors and at least one communication chip 606, each of which can be physically and electrically coupled to the motherboard 602, or otherwise integrated therein. As will be appreciated, the motherboard 602 may be, for example, any printed circuit board, whether a main board, a daughterboard mounted on a main board, or the only board of computing device 600, etc.

Depending on its applications, computing device 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 600 may include one or more integrated PN diodes and group III-nitride transistors formed using the disclosed techniques in accordance with an example embodiment or PN diodes and group III-nitride transistors integrated with silicon CMOS transistor devices. In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others. In some embodiments, communication chip 606 may be implemented with the techniques and/or structures variously described herein, such that the communication chip 606 includes one or more PN diodes and group III-nitride transistors including a dual drain/gate and single source heterostructure design, for example.

The processor 604 of the computing device 600 includes an integrated circuit die packaged within the processor 604. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 604 (e.g., where functionality of any communication chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing device 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 7:
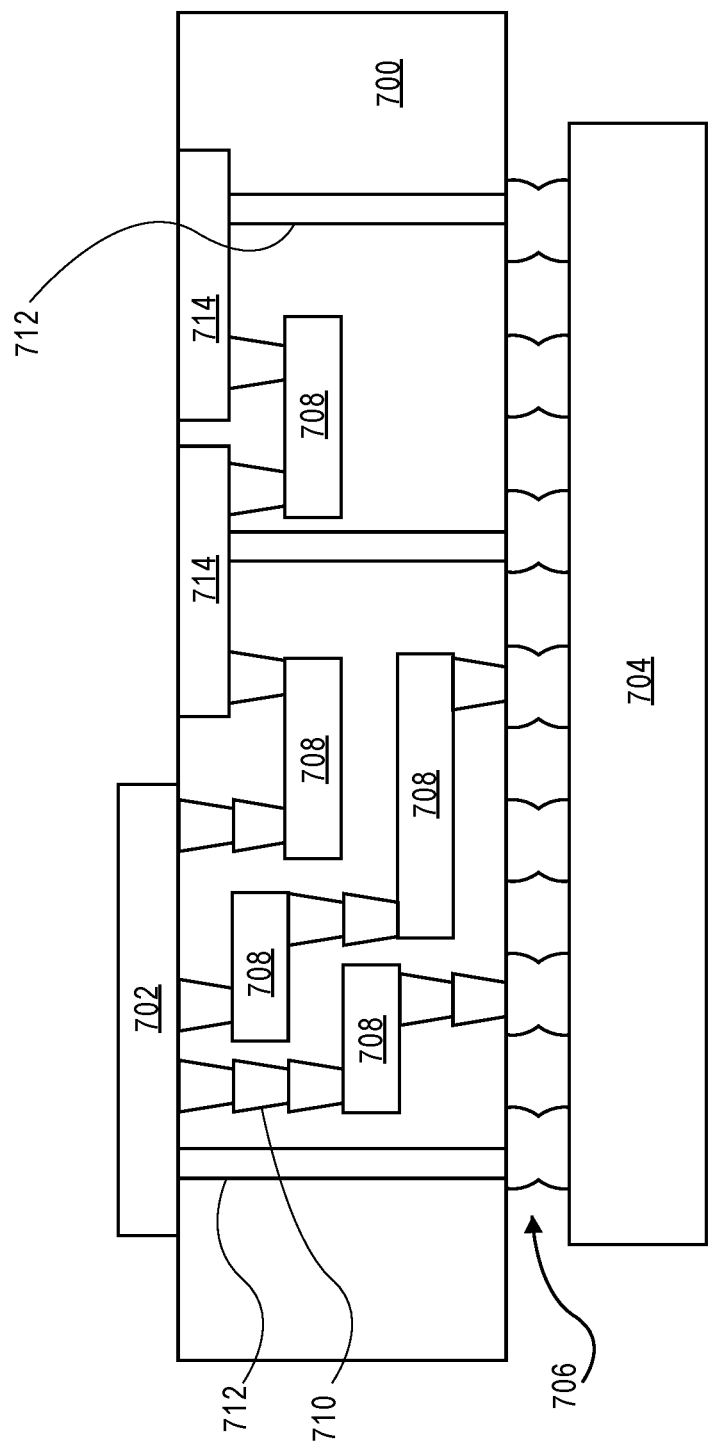
FIG. 7 illustrates an interposer in accordance with embodiments of the present invention.

FIG. 7 illustrates an interposer 700 in accordance with embodiments of the present invention. The interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a logic module including an array of PN diodes and an array of group III-nitride transistors, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Thus, embodiments of the present invention include PN diodes and connected group III-N devices and their methods of fabrication.

Example 1: A semiconductor structure, includes silicon substrate, wherein a group III-N semiconductor material is disposed on the silicon substrate. A group III-N transistor structure is disposed on the group III-N semiconductor material. A well is disposed in the silicon substrate, wherein the well has a first conductivity type. A doped region is disposed in the well, wherein the doped region has a second conductivity type opposite the first conductivity type. A first electrode is connected to the well of the second conductivity type. A second electrode is connected to the doped region having a first conductivity type, wherein the well and the doped region form a PN diode.

Example 2: The semiconductor structure of Example 1, wherein the group III-N transistor has a gate, a source and a drain and wherein the drain is coupled to one of the first electrode or the second electrode.

Example 3: The semiconductor structure of Example 1, further includes a patterned insulator having a plurality of openings disposed on the silicon substrate, wherein the group III-N material is disposed on the silicon substrate in a portion of the openings in the insulating layer and on the insulating layer, and wherein the well region and the doped region are disposed in one of the plurality of openings in the insulating layer on the silicon substrate.

Example 4: The semiconductor structure of Example 1 or Example 2, wherein the silicon substrate is undoped.

Example 5: The semiconductor structure of Example 1, wherein the first conductivity is an n-type and second conductivity is p-type.

Example 6: The semiconductor structure of Example 1, wherein the first conductivity is an p-type and second conductivity is n-type.

Example 7: The semiconductor structure of Example 1 or Example 4, wherein the group III-N transistor comprises a gate dielectric layer, wherein the gate dielectric layer is disposed in the opening above the well.

Example 8: A semiconductor structure, includes a silicon substrate and a patterned insulator layer disposed on the silicon substrate, wherein the patterned insulator layer has a plurality of openings. The semiconductor structure further includes a PN diode structure, wherein the PN diode structure includes a well in one of the plurality of openings of the patterned insulator layer and a doped region in the well in the one of the plurality of openings. A first electrode is connected to the doped region. A second electrode is connected to the well. The semiconductor structure further includes a group III-N transistor structure, wherein the group III-N transistor structure includes a group III-N semiconductor material disposed on the silicon substrate in a portion of the plurality of openings. A raised source structure and a raised drain structure are disposed in the group III-N semiconductor material. A mobility enhancement layer is disposed on the group III-N semiconductor material between the raised source structure and a raised drain structure. A polarization charge inducing layer is disposed above the mobility enhancement layer, wherein the polarization charge inducing layer has a first portion and a second portion that is separated by a gap. A gate dielectric layer is disposed above the mobility enhancement layer in the gap. A gate electrode is disposed on the gate dielectric layer above the gap and between the raised drain structure and the raised source structure.

Example 9: The semiconductor structure of Example 8, wherein the patterned insulator layer has a portion that is between the PN diode structure and the group III-N transistor structure.

Example 10: The semiconductor structure of Example 8 or Example 9, further includes an insulator layer on the portion of the patterned insulator layer, above the group III-N semiconductor material, and on the well.

Example 11: The semiconductor structure of Example 8, wherein the group III-N semiconductor material includes a gallium nitride (GaN) and the polarization charge inducing layer includes a group III-N semiconductor material that includes aluminum.

Example 12: The semiconductor structure of Example 8, wherein the mobility enhancement layer is AlN.

Example 13: The semiconductor structure of Example 8, wherein the raised source structures and the raised drain structures include n-type impurity dopants.

Example 14: The semiconductor structure of Example 8, wherein the gate electrode comprises a work function layer and a gate metal cap.

Example 15: The semiconductor structure of Example 8, wherein the first metal electrode and the second metal electrode comprise one or more layers of a metal and a metal alloy.

Example 16: The semiconductor structure of Example 8, wherein the doped region contains phosphorus and the well contains boron.

Example 17: A method of fabricating a semiconductor structure, wherein fabricating a semiconductor structure includes providing a substrate and forming a III-N semiconductor material on the substrate. The method further includes forming a mobility enhancement layer on the group III-N semiconductor material. The method further includes forming a polarization charge inducing layer on the mobility enhancement layer. The method further includes forming a well in the substrate after forming the polarization charge inducing layer. The method further includes forming a raised source structure and a raised drain structure on the group III-N semiconductor material. The method further includes forming a recess in the polarization charge inducing layer, the recess providing a gap separating a first portion of the polarization charge inducing layer from a second portion of the polarization charge inducing layer. The method further includes forming a gate dielectric layer on the mobility enhancement layer in the gap. The method further includes forming a first opening in a dielectric layer, the opening exposing the gate dielectric layer over the gap. The method further includes forming a gate electrode in the first opening in the group III-N transistor region. The method further includes forming doped region in the well. The method further includes forming a first electrode on the doped region and forming a second electrode on the well.

Example 18: The method of fabricating the semiconductor structure of Example 17, wherein forming the semiconductor structure includes forming a patterned insulator layer having a plurality of openings on the substrate between the group III-N transistor and the well.

Example 19: The method of fabricating the semiconductor structure of Example 17, wherein forming the semiconductor structure includes forming the group III-N semiconductor material on a silicon substrate.

Example 20: The method of fabricating the semiconductor structure of Example 17, wherein forming the well and the doped region includes forming the doped region with a second conductivity type opposite to the first conductivity type of the well.

Example 21: A method of fabricating a semiconductor structure, wherein fabricating a semiconductor structure includes providing a substrate and forming an insulator layer on the substrate separating a group III-N transistor region from a PN diode region. The method further includes forming a group III-N semiconductor material on the substrate in the group III-N transistor region. The method further includes forming a mobility enhancement layer on the group III-N semiconductor material. The method further includes forming a polarization charge inducing layer on the mobility enhancement layer. The method further includes forming polarization charge inducing layer, after forming a well in the silicon substrate in the PN diode region. The method further includes forming a first insulator layer on the polarization charge inducing layer. The method further includes forming a second insulator layer on the first insulator layer in the group III-N transistor region, and forming the second insulator layer on the well of the PN diode region. The method further includes forming an opening in the first and second insulator layers in the group III-N transistor region above an uppermost surface of the group III-N semiconductor material. The method further includes forming a raised source structure and a raised drain structure in the group III-N transistor region. The method further includes forming a recess in the polarization charge inducing layer, wherein the recess provides a gap separating a first portion of the polarization charge inducing layer from a second portion of the polarization charge inducing layer. The method further includes forming a gate dielectric layer on the mobility enhancement layer in the gap. The method further includes forming a first opening in a dielectric layer, wherein the opening exposes the gate dielectric layer over the gap. The method further includes forming a gate electrode in the first opening in the group III-N transistor region. The method further includes forming a second opening in the dielectric layer, wherein the second opening exposes a portion of the well in the PN diode region. The method further includes performing a doped region implant through the second opening to form a doped region in the well. The method further includes forming a first electrode in the second opening on the doped region. The method further includes forming a third opening in the dielectric layer, wherein the third opening exposes a portion of the well in the PN diode region. The method further includes forming a second electrode in the third opening on the well.

Example 22: The method of fabricating the semiconductor structure of Example 21, wherein forming the second opening and the third opening in the dielectric includes etching the gate dielectric layer and the second insulator in the PN diode region.

Example 23: The method of fabricating the semiconductor structure of Example 21, wherein forming the raised drain structure and the raised source structure, includes forming a trench in the polarization charge inducing layer, in the mobility enhancement layer and in the group III-N semiconductor material.

Example 24: The method of fabricating the semiconductor structure of Example 21, wherein forming the well and the doped region includes forming the doped region with a second conductivity type opposite to the first conductivity type of the well.

What is claimed is:
1. A semiconductor structure comprising:
a silicon substrate;

a group III-N semiconductor material disposed on the silicon substrate;

a group III-N transistor structure disposed on the group III-N semiconductor material;

a well disposed in the silicon substrate, the well having a first conductivity type;

a doped region disposed in the well, the doped region having a second conductivity type opposite the first conductivity type;

a first electrode connected to the well of the first conductivity type; and a second electrode connected to the doped region having the second conductivity type, wherein the well and the doped region form a PN diode.

2. The semiconductor structure of claim 1, wherein the group III-N transistor has a gate, a source and a drain, wherein the drain is coupled to one of the first electrode or the second electrode.

3. The semiconductor structure of claim 1, further comprising a patterned insulating layer having a plurality of openings disposed on the silicon substrate, wherein the group III-N semiconductor material is disposed on the silicon substrate in a portion of the openings in the patterned insulating layer, and the group III-N semiconductor material disposed on the patterned insulating layer, and wherein one of the openings in the patterned insulating layer exposes the well region and the doped region in the silicon substrate.

4. The semiconductor structure of claim 1, wherein the silicon substrate is undoped.

5. The semiconductor structure of claim 1, wherein the first conductivity type is n-type and the second conductivity type is p-type.

6. The semiconductor structure of claim 1, wherein the first conductivity type is p-type and the second conductivity type is n-type.

7. The semiconductor structure of claim 1, wherein the group III-N transistor structure comprises a gate dielectric layer, wherein the gate dielectric layer is disposed in the opening above the well.

8. A semiconductor structure comprising:

a silicon substrate;

a patterned insulator layer disposed on the silicon substrate, the patterned insulator layer having a plurality of openings;

a PN diode structure, comprising:
  a well in one of the plurality of openings of the patterned insulator layer;
  a doped region in the well in the one of the plurality of openings;
  a first electrode connected to the doped region;
  a second electrode connected to the well;

a group III-N transistor structure comprising: a group III-N semiconductor material disposed on the silicon substrate in a portion of the plurality of openings;
  a raised source structure and a raised drain structure disposed in the group III-N semiconductor material;
  a mobility enhancement layer disposed on the group III-N semiconductor material between the raised source structure and the raised drain structure;
  a polarization charge inducing layer disposed above the mobility enhancement layer, the polarization charge inducing layer having a first portion and a second portion separated by a gap;
  a gate dielectric layer disposed above the mobility enhancement layer in the gap; and
  a gate electrode disposed on the gate dielectric layer above the gap and between the raised drain structure and the raised source structure.

9. The semiconductor structure of claim 8, wherein the patterned insulator layer has a portion that is between the PN diode structure and the group III-N transistor structure.

10. The semiconductor structure of claim 8, further comprising an insulator layer on a portion of the patterned insulator layer, above the group III-N semiconductor material, and on the well.

11. The semiconductor structure of claim 8, wherein the group III-N semiconductor material includes a gallium nitride (GaN) and the polarization charge inducing layer includes a group III-N semiconductor material that includes aluminum.

12. The semiconductor structure of claim 8, wherein the mobility enhancement layer is AlN.

13. The group III-N transistor structure of claim 8, wherein the raised source structures and the raised drain structures include n-type impurity dopants.

14. The group III-N transistor structure of claim 8, wherein the gate electrode comprises a work function layer and a gate metal cap.

15. The semiconductor structure of claim 8, wherein the first electrode and the second electrode comprise one or more layers of a metal and a metal alloy.

16. The semiconductor structure of claim 8, wherein the doped region contains phosphorus and the well contains boron.

17. A method of fabricating a semiconductor structure, the method comprising:

providing a substrate;

forming a III-N semiconductor material on the substrate;

forming a mobility enhancement layer on the group III-N semiconductor material;

forming a polarization charge inducing layer on the mobility enhancement layer;

forming a well in the substrate after forming the polarization charge inducing layer;

forming a raised source structure and a raised drain structure on the group III-N semiconductor material;

forming a recess in the polarization charge inducing layer, the recess providing a gap separating a first portion of the polarization charge inducing layer from a second portion of the polarization charge inducing layer;

forming a gate dielectric layer on the mobility enhancement layer in the gap;

forming a dielectric layer over the gate dielectric layer;

forming a first opening in the dielectric layer, the first opening exposing the gate dielectric layer over the gap;

forming a gate electrode in the first opening in a group III-N transistor region;

forming a doped region in the well in a PN diode region;

forming a first electrode on the doped region; and forming a second electrode on the well.

18. The method of claim 17, wherein forming the semiconductor structure includes forming a patterned insulator layer having a plurality of openings on the substrate between the group III-N transistor region and the well.

19. The method of claim 17, wherein forming the semiconductor structure includes forming the group III-N semiconductor material on a silicon substrate.

20. The method of claim 17, wherein forming the well and the doped region includes forming the doped region with a second conductivity type opposite to a first conductivity type of the well.

21. A method of fabricating a semiconductor structure, the method comprising:
- providing a silicon substrate having a group III-N transistor region and a PN diode region;
- forming a first insulator layer on the silicon substrate;
- forming a group III-N semiconductor material on the silicon substrate in the group III-N transistor region;
- forming a mobility enhancement layer on the group III-N semiconductor material;
- forming a polarization charge inducing layer on the mobility enhancement layer;
- after forming the polarization charge inducing layer, forming a well in the silicon substrate in the PN diode region;
- forming a second insulator layer on the polarization charge inducing layer;
- forming a third insulator layer on the second insulator layer in the group III-N transistor region, and forming the third insulator layer on the well of the PN diode region;
- forming an opening in the second and third insulator layers in the group III-N transistor region above an uppermost surface of the group III-N semiconductor material;
- forming a raised source structure and a raised drain structure in the group III-N transistor region;
- forming a recess in the polarization charge inducing layer, the recess providing a gap separating a first portion of the polarization charge inducing layer from a second portion of the polarization charge inducing layer;
- forming a gate dielectric layer on the mobility enhancement layer in the gap;
- forming a fourth insulator layer over the gate dielectric layer;
- forming a first opening in the fourth insulator layer, the first opening exposing the gate dielectric layer over the gap;
- forming a gate electrode in the first opening in the fourth insulator layer in the group III-N transistor region;
- forming a second opening in the fourth insulator layer, the second opening exposing a portion of the well in the PN diode region;
- performing a doped region implant through the second opening in the fourth insulator layer to form a doped region in the well;
- forming a first electrode in the second opening and on the doped region;
- forming a third opening in the fourth insulator layer, the third opening exposing a portion of the well in the PN diode region; and
- forming a second electrode in the third opening and on the well.

22. The method of claim 21, wherein forming the second opening and the third opening in the fourth insulator layer includes etching the gate dielectric layer and the third insulator layer in the PN diode region.

23. The method of claim 21, wherein forming the raised drain structure and the raised source structure, includes forming a trench in the polarization charge inducing layer, in the mobility enhancement layer and in the group III-N semiconductor material.

24. The method of claim 21, wherein forming the well and the doped region includes forming the doped region with a second conductivity type opposite to a first conductivity type of the well.

* * * * *